(12) United States Patent
Takahashi et al.

(10) Patent No.: US 9,735,056 B2
(45) Date of Patent: Aug. 15, 2017

(54) SEMICONDUCTOR PIECE MANUFACTURING METHOD AND SUBSTRATE DICING METHOD FOR SUPPRESSING BREAKAGE

(71) Applicant: FUJI XEROX CO., LTD., Tokyo (JP)

(72) Inventors: Mutsuya Takahashi, Ebina (JP); Shuichi Yamada, Ebina (JP); Michiaki Murata, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/922,301

(22) Filed: Oct. 26, 2015

(65) Prior Publication Data

US 2016/0056080 A1 Feb. 25, 2016

Related U.S. Application Data

(63) Continuation of application No. PCT/JP2014/066896, filed on Jun. 25, 2014.

(30) Foreign Application Priority Data

| Jul. 1, 2013 | (JP) | ................................ | 2013-137829 |
| Jul. 1, 2013 | (JP) | ................................ | 2013-137834 |

(Continued)

(51) Int. Cl.
*H01L 21/78* (2006.01)
*H01L 21/304* (2006.01)
(Continued)

(52) U.S. Cl.
CPC .......... *H01L 21/78* (2013.01); *H01L 21/3043* (2013.01); *H01L 21/3065* (2013.01);
(Continued)

(58) Field of Classification Search
CPC ............. H01L 21/3043; H01L 21/3065; H01L 21/30655; H01L 21/6836; H01L 21/78;
(Continued)

(56) References Cited

U.S. PATENT DOCUMENTS

| 5,284,792 A | 2/1994 | Forster et al. |
| 6,515,309 B1 * | 2/2003 | Tohyama ............... H01L 27/153 |
| | | 257/88 |

(Continued)

FOREIGN PATENT DOCUMENTS

| CN | 101942278 A | 1/2011 |
| EP | 3018702 A1 | 5/2016 |

(Continued)

OTHER PUBLICATIONS

Int. Search Report dated Aug. 5, 2014 issued by the Int. Searching Authority in corresponding Application No. PCT/JP2014/066896 (PCT/ISA/210).

(Continued)

*Primary Examiner* — Thanh T Nguyen
(74) *Attorney, Agent, or Firm* — Sughrue Mion, PLLC

(57) ABSTRACT

A semiconductor piece manufacturing method includes: a process of forming a groove on a front surface side including a first groove portion having a first width from a front surface of a substrate and a second groove portion that is positioned in a lower part that communicates with the first groove portion and has a second width larger than the first width; and a process of forming a groove on a rear surface side having a width greater than the first width along the second groove portion from a rear surface of the substrate by a rotating cutting member.

21 Claims, 14 Drawing Sheets

(30) Foreign Application Priority Data

| May 27, 2014 | (JP) | ................................. | 2014-109041 |
| May 27, 2014 | (JP) | ................................. | 2014-109042 |
| May 27, 2014 | (JP) | ................................. | 2014-109043 |

(51) Int. Cl.
  *H01L 21/3065* (2006.01)
  *H01L 21/683* (2006.01)
  *H01L 33/00* (2010.01)

(52) U.S. Cl.
  CPC .... *H01L 21/30655* (2013.01); *H01L 21/6836* (2013.01); *H01L 21/304* (2013.01); *H01L 33/0095* (2013.01); *H01L 2221/6834* (2013.01); *H01L 2221/68327* (2013.01); *H01L 2221/68381* (2013.01)

(58) Field of Classification Search
  CPC ... H01L 2221/68327; H01L 2221/6834; H01L 2221/68381; H01L 33/0095; H01L 21/304; H01L 21/683
  See application file for complete search history.

(56) References Cited

U.S. PATENT DOCUMENTS

| 7,897,485 | B2 | 3/2011 | Parekh |
| 2001/0023960 | A1 | 9/2001 | Soga et al. |
| 2003/0121511 | A1 | 7/2003 | Hashimura et al. |
| 2006/0079072 | A1 | 4/2006 | David et al. |
| 2007/0249178 | A1 | 10/2007 | Ogihara |
| 2011/0008949 | A1 | 1/2011 | Sugimura et al. |
| 2011/0062479 | A1* | 3/2011 | Sugano ............... H01L 33/0095 257/98 |
| 2012/0061827 | A1 | 3/2012 | Fujita |

FOREIGN PATENT DOCUMENTS

| JP | 61-267343 | A | 11/1986 |
| JP | 4-10554 | A | 1/1992 |
| JP | 6-37404 | A | 2/1994 |
| JP | 9-102473 | A | 4/1997 |
| JP | 2000-195827 | A | 7/2000 |
| JP | 2001-244325 | A | 9/2001 |
| JP | 2001284293 | A | 10/2001 |
| JP | 2005-277297 | A | 10/2005 |
| JP | 2008-300870 | A | 12/2008 |
| JP | 2009-88109 | A | 4/2009 |
| JP | 2011-18669 | A | 1/2011 |
| JP | 2011-210944 | A | 10/2011 |
| JP | 2012-84871 | A | 4/2012 |

OTHER PUBLICATIONS

Written Opinion dated Aug. 5, 2014 issued by the Int. Searching Authority in corresponding Application No. PCT/JP2014/066896 (PCT/ISA/237).

Communication issued Mar. 21, 2017, issued by the State Intellectual Property Office of the People's Republic of China in counterpart Chinese Patent Application No. 201480035154.2.

Extended European Research Report issued on May 19, 2017, issued by the European Patent Office in counterpart European Application No. 14820165.0.

* cited by examiner

COMPARISON OF MAXIMUM STRESS VALUES

● : RADICALS
○ : IONS

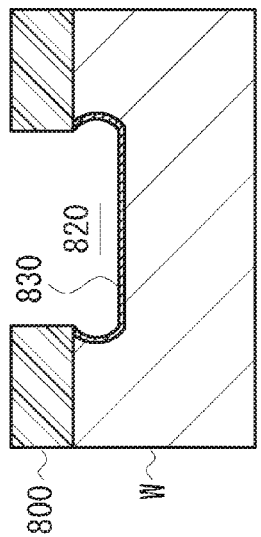
FIG. 13A
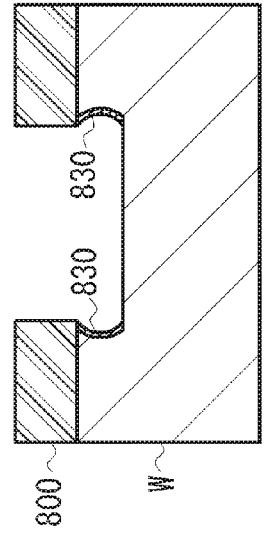
FIG. 13B
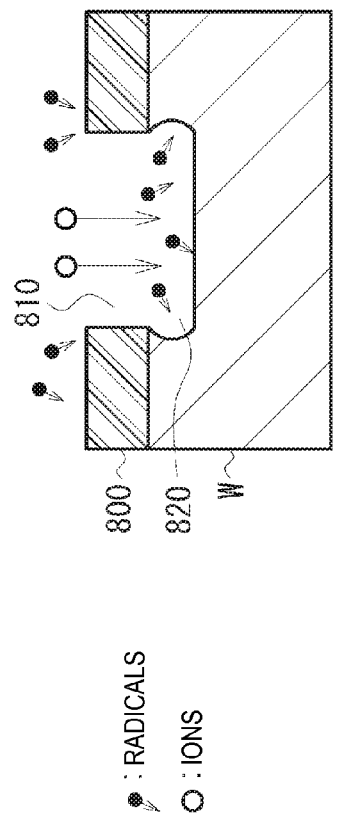
FIG. 13C
FIG. 13D
FIG. 13E

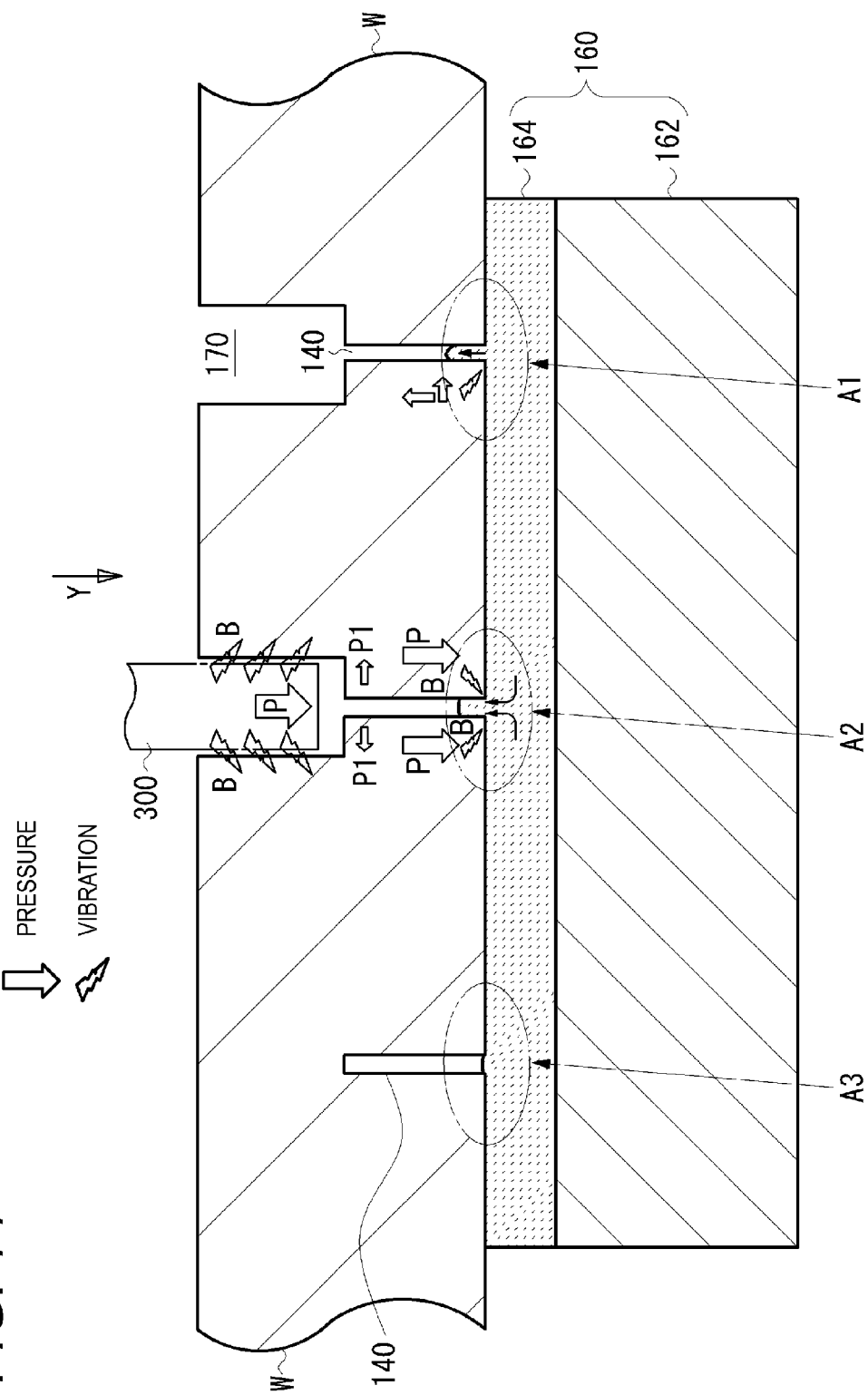

SEMICONDUCTOR PIECE MANUFACTURING METHOD AND SUBSTRATE DICING METHOD FOR SUPPRESSING BREAKAGE

CROSS REFERENCE TO RELATED APPLICATION

This is a continuation of International Application No. PCT/JP2014/066896 filed on Jun. 25, 2014, and claims priority from Japanese Patent Application No. 2013-137829, filed on Jul. 1, 2013, Japanese Patent Application No. 2013-137834, filed on Jul. 1, 2013, Japanese Patent Application No. 2014-109041, filed on May 27, 2014, Japanese Patent Application No. 2014-109042, filed on May 27, 2014, and Japanese Patent Application No. 2014-109043, filed on May 27, 2014.

BACKGROUND

Technical Field

The present invention relates to a semiconductor piece manufacturing method and a substrate dicing method.

SUMMARY

An aspect of the present invention provides a semiconductor piece manufacturing method including: a process of forming a groove on a front surface side including a first groove portion having a first width from a front surface of a substrate and a second groove portion that is positioned in a lower part that communicates with the first groove portion and has a second width larger than the first width; and a process of forming a groove on a rear surface side having a width greater than the first width along the second groove portion from a rear surface of the substrate by a rotating cutting member.

BRIEF DESCRIPTION OF THE DRAWINGS

Exemplary embodiment(s) of the present invention will be described in detail based on the following figures, wherein:

FIGS. 13A to 13E are cross-sectional views schematically illustrating a process of manufacturing a fine groove of a reversed tapered shape by the second manufacturing method according to the embodiment of the invention;

FIG. 14 is a cross-sectional view illustrating details about half dicing performed by a dicing blade;

DETAILED DESCRIPTION

Figure 1:
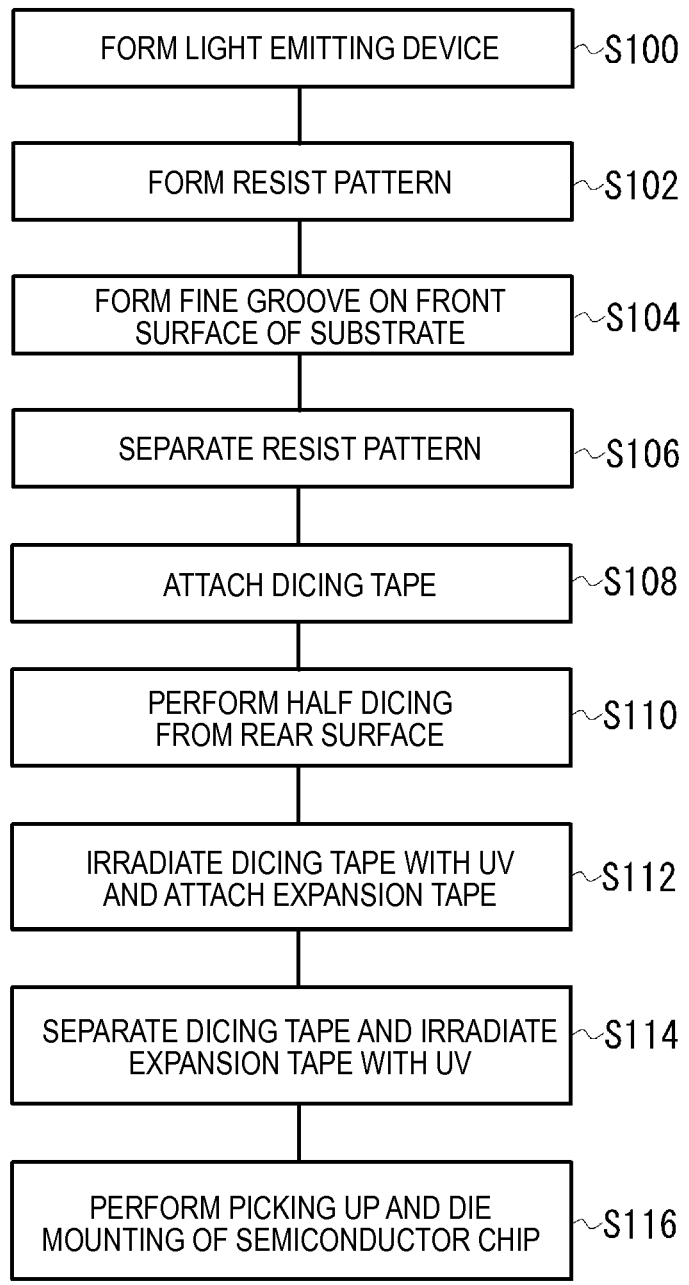
FIG. 1 is a flowchart illustrating an example of a semiconductor piece manufacturing process according to an embodiment of the invention.

A semiconductor piece manufacturing method of the invention is applied to a method for dividing (individualizing) a substrate shaped member such as a semiconductor wafer on which plural semiconductor devices are formed to manufacture individual semiconductor pieces (semiconductor chips). The semiconductor device formed on the substrate is not particularly limited, and may include a light emitting device, an active device, a passive device, or the like. In a preferred embodiment, the manufacturing method of the invention is applied to a method of extracting a semiconductor piece that includes a light emitting device from a substrate, in which the light emitting device may be a surface emitting semiconductor laser, a light emitting diode or a light emitting thyristor, for example. A single semiconductor piece may include a single light emitting device, or may include plural light emitting devices that are arranged in an array form. Further, the single semiconductor piece may include a drive circuit that drives the single or plural light emitting devices. Further, the substrate may be a substrate formed of silicon, SiC, compound semiconductor, sapphire, or the like, but not limited thereto, and may be a substrate formed of other materials as long as the substrate is a substrate including at least the semiconductor (hereinafter, collectively referred to as a semiconductor substrate). In a preferred embodiment, the substrate is a III-V compound semiconductor substrate made of GaAs or the like on which a light emitting device such as a surface light emitting semiconductor laser or a light emitting diode is formed.

In the following description, a method for extracting individual semiconductor pieces (semiconductor chips) from a semiconductor substrate on which plural light emitting devices are formed will be described with reference to the accompanying drawings. It should be noted that the scale or shape in the drawings is emphasized for ease of understanding of features of the invention and is not necessarily the same as the scale or shape of an actual apparatus.

Embodiment

FIG. 1 is a flowchart illustrating an example of a semiconductor piece manufacturing process according to an embodiment of the invention. As shown in FIG. 1, the semiconductor piece manufacturing method of the present embodiment includes a process of forming a light emitting device (S100), a process of forming a resist pattern (S102), a process of forming a fine groove on a front surface of a semiconductor substrate (S104), a process of removing the resist pattern (S106), a process of attaching a dicing tape to the front surface of the semiconductor substrate (S108), a process of performing half dicing from a rear surface of the semiconductor substrate (S110), a process of irradiating the dicing tape with ultraviolet rays (UV) and attaching an expansion tape to the rear surface of the semiconductor substrate (S112), a process of removing the dicing tape and irradiating the expansion tape with ultraviolet rays (S114), and a process of picking up a semiconductor piece (semiconductor chip) to perform die mounting on a circuit board or the like (S116). Cross-sectional views of a semiconductor substrate shown in FIGS. 2A to 2D and FIGS. 3A to 3E correspond to the respective processes of steps S100 to S116, respectively.

Figure 2A:
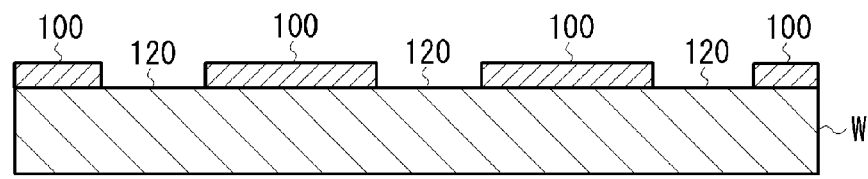
FIGS. 2A to 2D are cross-sectional views schematically illustrating a semiconductor substrate in a semiconductor piece manufacturing process according to an embodiment of the invention.

In the process of forming the light emitting device (S100), as shown in FIG. 2A, plural light emitting devices 100 are formed on a front surface of a semiconductor substrate W made of GaAs or the like. The light emitting device 100 is a surface light emitting semiconductor laser, a light emitting diode, a light emitting thyristor, or the like. In the figure, it is shown that one region corresponds to the light emitting device 100, but one light emitting device 100 is only an example of a device included in one individualized semiconductor piece. Thus, it should be noted that plural light emitting devices or another circuit element as well as one light emitting device 100 may be included in the region of the light emitting device.

Figure 4:
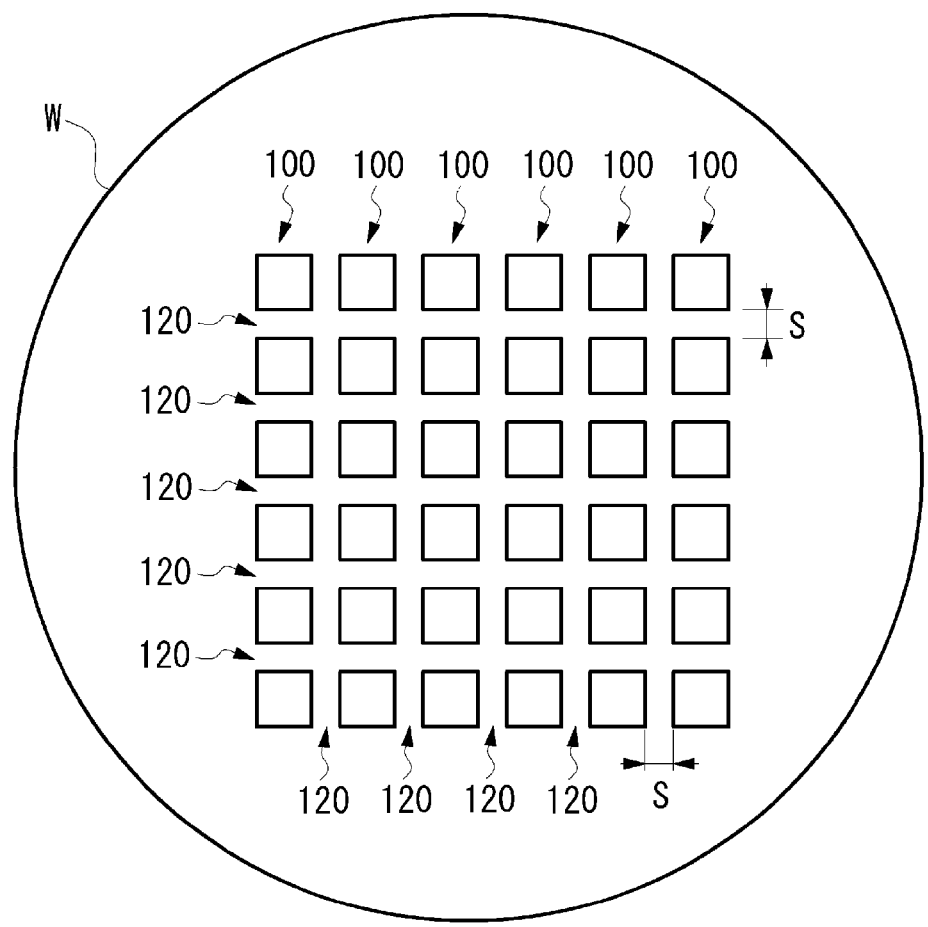
FIG. 4 is a plan view schematically illustrating a semiconductor substrate (wafer) when circuit formation is completed.

FIG. 4 is a plan view illustrating an example of the semiconductor substrate W when the light emitting device forming process is completed. In the figure, for ease of description, only the light emitting devices 100 in a central portion thereof are shown. On the front surface of the semiconductor substrate W, the plural light emitting devices 100 are arranged in an array form in row and column directions. A planar region of one light emitting device 100 generally has a rectangular shape, and the respective light emitting devices 100 are spaced from each other in a grid shape by cutting regions 120 defined by scribe lines or the like with a predetermined space S.

Figure 2B:
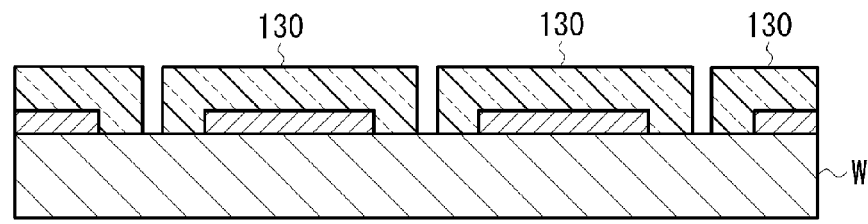

If the formation of the light emitting device is completed, a resist pattern is formed on the front surface of the semiconductor substrate W (S102). As shown in FIG. 2B, a resist pattern 130 is processed so that the cutting region 120 defined by the scribe line or the like on the front surface of the semiconductor substrate W is exposed. The processing of the resist pattern 130 is performed by a photolithography process.

Figure 2C:
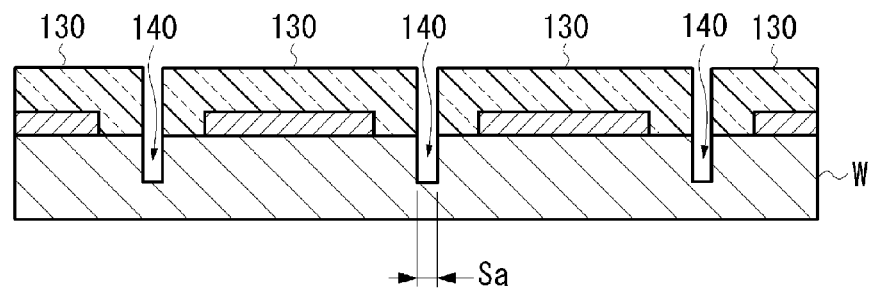

Then, a fine groove is formed on the front surface of the semiconductor substrate W (S104). As shown in FIG. 2C, a fine groove (hereinafter, for ease of description, referred to as a fine groove or a front surface side groove) 140 having a predetermined depth is formed on the front surface of the semiconductor substrate W using the resist pattern 130 as a mask. Such a groove may be formed by anisotropic etching, and preferably, is formed by anisotropic plasma etching which is anisotropic dry etching (reactive ion etching). The groove may be formed by a thin dicing blade, isotropic etching, or the like, but it is preferable that the anisotropic dry etching is used since a narrow deep groove can be formed compared with a case where the front surface side groove is formed by isotropic etching, and since the influence of vibration, stress or the like on the light emitting device 100 in the vicinity of the fine groove can be suppressed compared with a case where the dicing blade is used. A width Sa of the fine groove 140 is approximately the same as the width of an opening formed in the resist pattern 130. The width Sa of the fine groove 140 is several micrometers to ten and several micrometers, for example. Preferably, the width Sa is approximately 3 μm to approximately 15 μm. Further, the depth is about 10 μm to about 100 μm, for example, which is formed as a depth at least greater than a depth at which a functional element such as a light emitting device is formed. Preferably, the depth of the microgroove 140 is approximately 30 μm to approximately 80 μm. When the fine groove 140 is formed by a general dicing blade, a space S of the cutting region 120 increases by 40 μm to 60 μm as a total value of a groove width of the dicing blade and a margin width that reflects a pitching amount. On the other hand, when the fine groove 140 is formed by the semiconductor process, the groove width becomes narrow, and the margin width for cutting can also become narrower than the margin width when the dicing blade is used. In other words, the space S of the cutting region 120 can decrease, and thus, the light emitting devices can be disposed on the wafer with high density to increase the number of acquired semiconductor pieces. The "front surface side" in the embodiment refers to a surface side on which the functional element such as a light emitting device is formed, and a "rear surface side" refers to a surface side opposite to the "front surface side".

Figure 2D:
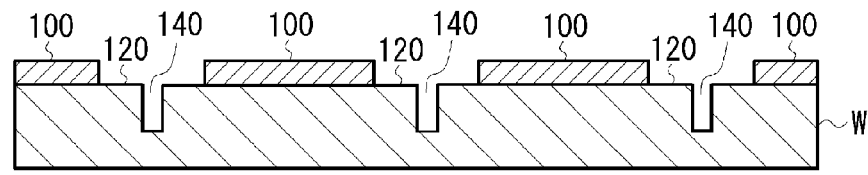

Then, the resist pattern is separated (S106). As shown in FIG. 2D, if the resist pattern 130 is separated from the front surface of the semiconductor substrate, the fine groove 140 formed along the cutting region 120 is exposed on the front surface. Details about the shape of the fine groove 140 will be described later.

Figure 3A:
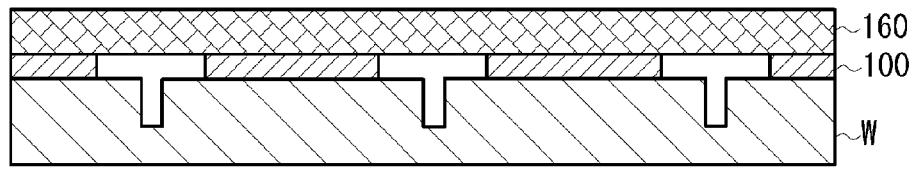
FIGS. 3A to 3E are cross-sectional views schematically illustrating a semiconductor substrate in a semiconductor piece manufacturing process according to an embodiment of the invention.
Figure 3B:
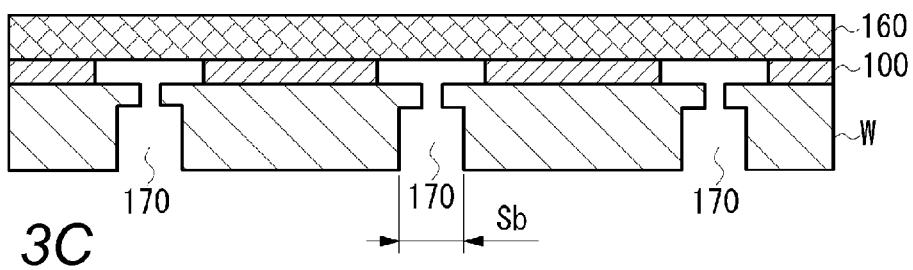

Then, an ultraviolet curing dicing tape is attached (S108). As shown in FIG. 3A, a dicing tape 160 having an adhesive layer is attached on the side of the light emitting device. Then, half dicing is performed along the fine groove 140 by a dicing blade from the rear surface side of the substrate (S110). Positioning of the dicing blade may use a method for disposing an infrared camera above the rear surface side of the substrate and allowing the substrate to transmit an infrared ray to indirectly detect the fine groove 140, a method for disposing a camera above the front surface side of the substrate and directly detecting the position of the fine groove 140, or other known methods. With such positioning, as shown in FIG. 3B, the half dicing is performed by the dicing blade, so that a groove 170 is formed on the rear side of the semiconductor substrate. The groove 170 has a depth that reaches the fine groove 140 formed on the front surface of the semiconductor substrate. Here, the fine groove 140 is formed with a width narrower than that of the groove 170 on the rear surface side by the dicing blade. This is because when the fine groove 140 is formed with the width narrower than that of the groove 170 on the rear surface side, the number of semiconductor pieces capable of being acquired from a single wafer can be increased compared with a case where the semiconductor substrate is cut only using the dicing blade. If the fine groove of several micrometers to ten and several micrometers shown in FIG. 2C can be formed in a range from the front surface of the semiconductor substrate to the rear surface thereof, it is not necessary to form the groove on the rear surface side using the dicing blade, but it is not easy to form the fine groove with such a depth. Accordingly, as shown in FIG. 3B, the half dicing from the rear surface using the dicing blade is combined.

Figure 3C:
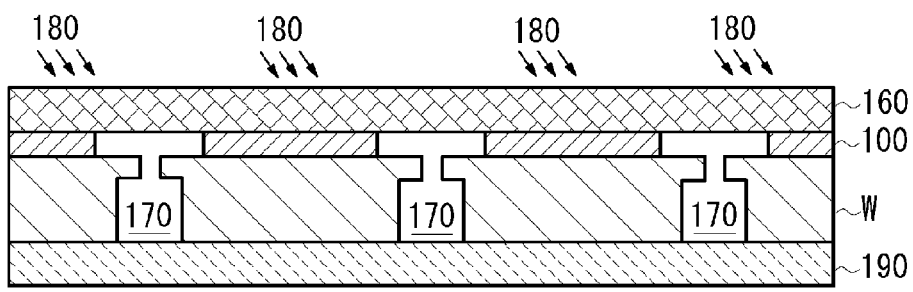

Then, the dicing tape is irradiated with ultraviolet rays (UV), and the expansion tape is attached (S112). As shown in FIG. 3C, the dicing tape 160 is irradiated with ultraviolet rays 180, so that the adhesive layer is cured. Then, an expansion tape 190 is attached to the rear surface of the semiconductor substrate.

Figure 3D:
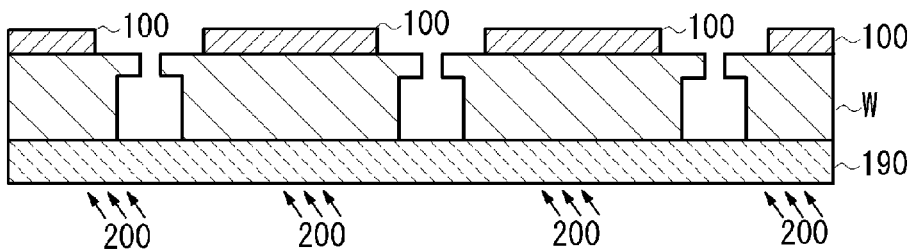

Then, the dicing tape is separated, and the expansion tape is irradiated with ultraviolet rays (S114). As shown in FIG. 3D, the dicing tape 160 is separated from the front surface of the semiconductor substrate. Further, the expansion table 190 on the rear surface of the substrate is irradiated with ultraviolet rays 200, so that the adhesive layer is cured. The expansion tape 190 has elasticity in a base material thereof. The tape is expanded to increase the interval between the light emitting devices so as to easily pick up the individualized semiconductor pieces after dicing.

Figure 3E:
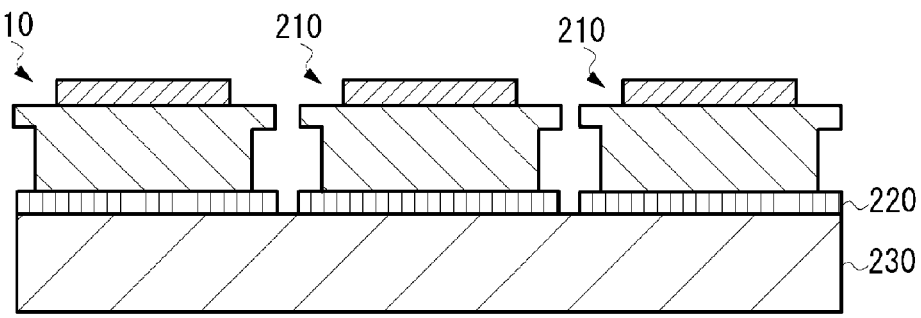

Then, pickup and die mounting of the individualized semiconductor pieces are performed (S116). As shown in FIG. 3E, a semiconductor chip 210 picked up from the expansion tape 190 is mounted on a circuit board 230 through a fixing member 220 such as a conductive paste such as an adhesive or solder.

Figure 5A:
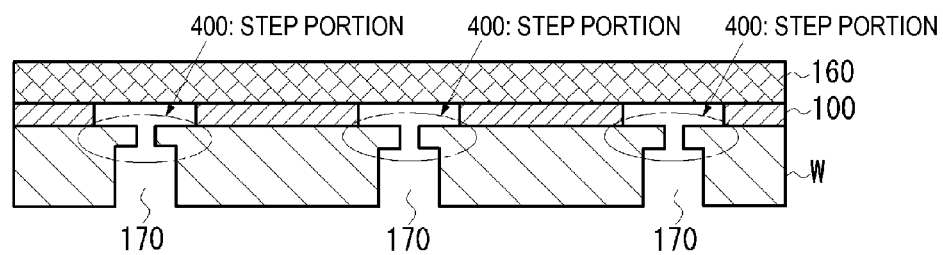
FIG. 5A is a cross-sectional view illustrating a step portion formed in a semiconductor chip.
Figure 5B:
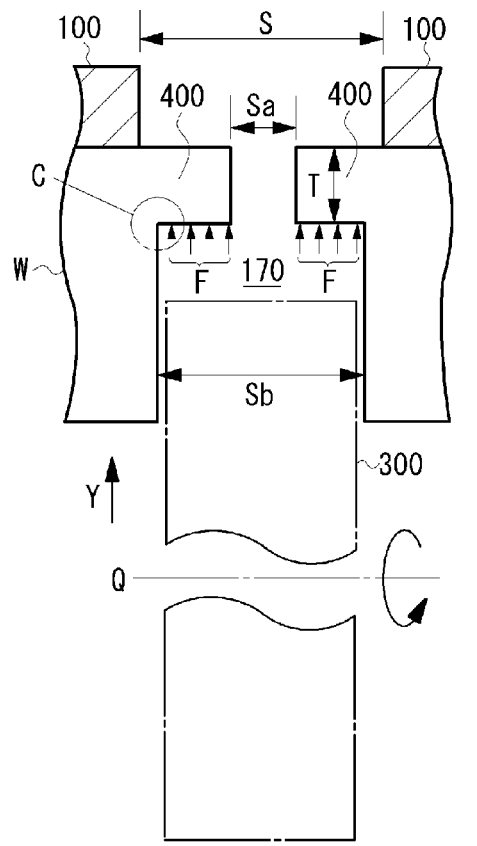
FIG. 5B is a diagram illustrating a load applied to the step portion during cutting performed by a dicing blade.
Figure 5C:
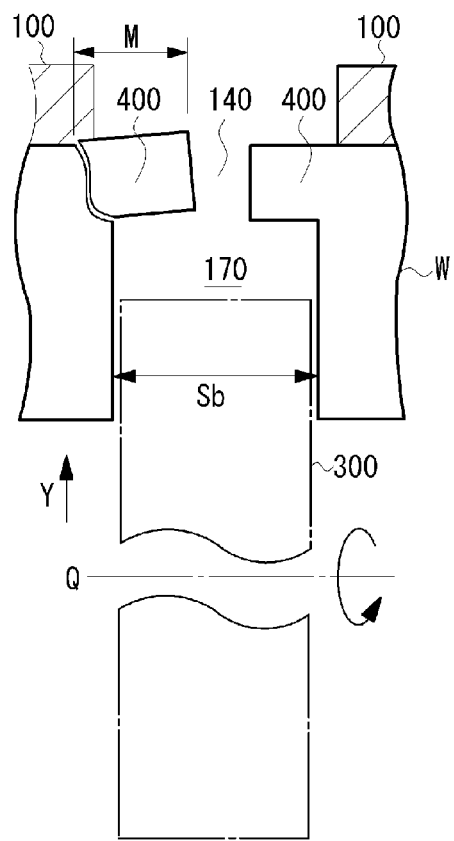
FIG. 5C is a diagram illustrating breakage of the step portion.

Next, details about the half dicing using the dicing blade will be described. FIG. 5A is a cross-sectional view when the half dicing is performed by the dicing blade shown in FIG. 3B, FIG. 5B is an enlarged view of a step portion shown in FIG. 5A, and FIG. 5C shows breakage of the step portion.

As described above, the plural light emitting devices 100 are formed on the front surface of the semiconductor substrate W, and are spaced from each other by the cutting regions 120 defined by the scribe lines or the like with the space S. The fine groove 140 of the width Sa is formed in the cutting region 120 by anisotropic dry etching. On the other hand, as shown in FIG. 5B, a dicing blade 300 is a cutting member of a disk shape that rotates around an axis Q, in which its tip portion has a rectangular shape and has a thickness corresponding to the groove 170 of a kerf width Sb. The dicing blade 300 is positioned outside the semiconductor substrate W in a direction parallel to the rear surface of the semiconductor substrate W. Further, by moving the dicing blade 300 in a direction Y perpendicular to the rear surface of the semiconductor substrate W by a predetermined distance, the positioning of the semiconductor substrate W is performed in the thickness direction so that a step portion 400 has a desired thickness T. Further, in a state where the dicing blade 300 is rotated after the positioning, at least one of the dicing blade 300 and the semiconductor substrate W is moved in the direction parallel to the rear surface of the semiconductor substrate W, to thereby form the groove 170 in the semiconductor substrate W. Since the kerf width Sb is larger than the width Sa of the fine groove 140, when the groove 170 reaches the fine groove 140, the step portion 400 of a cantilevered beam shape of the thickness T is formed in the cutting regions 120 by a difference between the width Sb and the width Sa. If the center of the dicing blade 300 and the center of the fine groove 140 completely match each other, an extended length of the step portion 400 in the transverse direction is (Sb−Sa)/2.

When the cutting is performed by the dicing blade 300, as the flat surface of the tip portion of the dicing blade 300 presses the substrate W in the Y direction, a force F is applied to the bottom surface of the step portion 400, and thus, a stress concentrates on a corner C of the step portion 400. When the stress to the corner C exceeds a fracture stress of the wafer, as shown in FIG. 5C, breakage (fragment, crack, picking or the like) of the step portion 400 occurs. Particularly, since the compound semiconductor substrate made of GaAs or the like has a strength weaker than that of a silicon substrate, the breakage easily occurs in the step portion 400. If the breakage occurs in the step portion 400, it is necessary to secure a margin M for cutting the step portion 400. This means that the space S of the cutting region 120 should be the equal to or larger than the margin M, and thus, the number of acquired semiconductor pieces decreases. Further, similarly, when the tip portion of the dicing blade 300 is not flat, if the stress exceeds the fraction stress of the wafer, the breakage may occur in the vicinity of the fine groove including the step portion 400 where the stress is applied. Accordingly, it is desirable to suppress the breakage in the vicinity of the fine groove including the step portion 400.

As factors having a high influence on the stress that causes the breakage of the step portion 400, the following three factors may be considered. The first factor is the shape of the tip portion of the dicing blade, the second factor is the thickness T of the step portion 400, and the third factor is the size of the step difference in the step portion 400, that is, a positional shift amount between the fine groove 140 and the groove 170 when the dicing blade 300 having a predetermined thickness is used. In order to reduce the stress to the step portion 400 by the shape of the tip portion of the dicing blade, it is necessary to evaluate which shape is optimal. Further, if the thickness T of the step portion 400 can be increased, it is possible to increase the fraction strength of the corner C of the step portion 400. However, when the fine groove 140 is formed by anisotropic dry etching, there is a restriction in the depth of the fine groove 140, and thus, it is difficult to increase the thickness T of the step portion 400 to a predetermined size or greater. Further, the positional shift between the center of the fine groove 140 and the center of the groove 170 is caused by the positioning accuracy or the like of the dicing blade, in which a predetermined amount of variation occurs in the positional shift in mass production. Thus, in the present embodiment, by changing the shape of the fine groove 140 formed on the front surface of the semiconductor substrate W, the stress to the step portion 400 is alleviated to suppress the breakage of the step portion 400 (breakage of the fine groove 140). In the present embodiment, the method for optimizing the shape of the tip portion of the dicing blade and the method for increasing the thickness T of the step portion 400 may be combined for use. Further, the suppression of the breakage in the present embodiment does not only include visually recognizable suppression of fragment, crack, picking or the like, but also includes even slight suppression of the degree of breakage or even slight reduction of the possibility of breakage occurrence. That is, the degree of suppression does not matter.

The fine groove according to the present embodiment is processed so that the width of the bottom portion is enlarged in the direction parallel to the front surface of the substrate, and typical configuration examples thereof are shown in FIGS. 6A to 6D. A fine groove 500 shown in FIG. 6A includes a first groove portion 510 having linear side surfaces that form an approximately uniform width Sa1 of a depth D1, and a second groove portion 520 that is connected to a lower part of the first groove portion 510 and has a spherical side and bottom surface having a depth D2. A width Sa2 of the second groove portion 520 is an internal diameter between side walls that face each other in the direction parallel to the front surface of the substrate, and satisfies the relation of Sa2>Sa1. In the example of the figure, the width Sa2 becomes maximum in the vicinity of the center of the second groove portion 520.

Figure 6A:
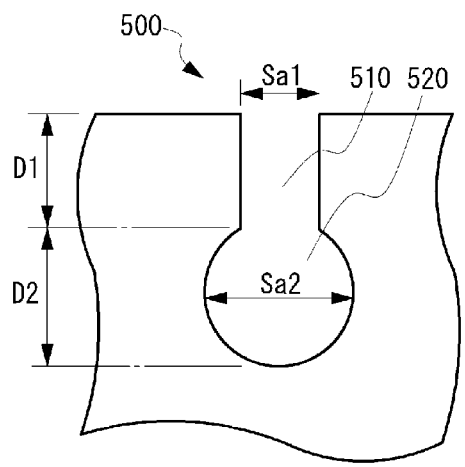
FIGS. 6A to 6D are cross-sectional views illustrating a typical configuration of a fine groove according to an embodiment of the invention.
Figure 6B:
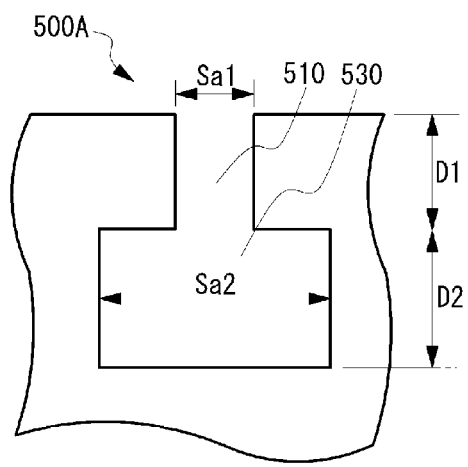

A fine groove 500A shown in FIG. 6B includes a first groove portion 510 having linear side surfaces that form an approximately uniform width Sa1 of a depth D1, and a rectangular second groove portion 530 that is connected to a lower part of the first groove portion 510 and has approximately uniform linear side surfaces of a depth D2. The second groove portion 530 is formed by changing the spherical side and bottom surface of the second groove portion 520 shown in FIG. 6A to a linear shape, in which a width Sa2 of the second groove portion 530 is a distance between side walls that face each other in the direction parallel to the front surface of the substrate, and the distance is approximately uniform (Sa2>Sa1). The shape of the second groove portion herein is illustrative, and the shape of the second groove portion may be any shape having a width larger than the width Sa1 of the first groove portion, and for example, may be an intermediate shape between the second groove portion 520 shown in FIG. 6A and the second groove portion 530 shown in FIG. 6B. That is, the second groove portion may be an elliptical shape. Further, in other words, the second groove portion may be any shape having a space of a width wider than the groove width (groove width at the depth of D1) at a boundary between the first groove portion and the second groove portion.

Figure 6C:
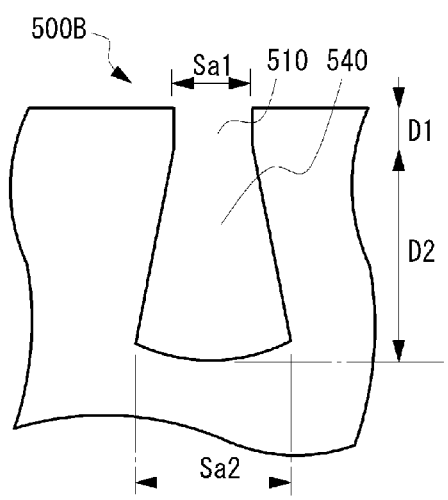

A fine groove 500B shown in FIG. 6C includes a first groove portion 510 having side surfaces that form an approximately uniform width Sa1 of a depth D1, and a second groove portion 540 that is connected to a lower part of the first groove portion 510 and has a reversed tapered shape of a depth D2. Side surfaces of the second groove portion 540 are inclined so that its width gradually increases toward a bottom portion. A width Sa2 of the second groove portion 540 is a distance between side surfaces that face each other in the direction horizontal to the front surface of the substrate, and the distance becomes maximum in the vicinity of the lowermost portion of the second groove portion 540 (in the vicinity of a lower end).

Figure 6D:
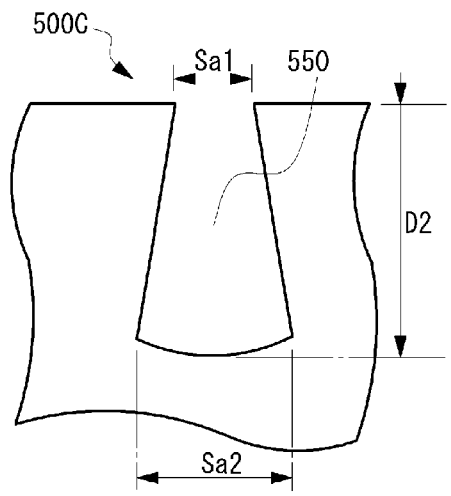

A fine groove 500C shown in FIG. 6D has a shape in which the width gradually increases from an opening width Sa1 of the front surface of the substrate to a width Sa2 in the vicinity of the lowermost portion. That is, the fine groove 500C is formed by a groove of a reversed tapered shape having a depth D2. The fine groove 500C is formed by extremely decreasing the depth D1 of the first groove portion 510 shown in FIG. 6C. The shape of FIG. 6D is not a shape in which the angle of the side surface is changed at the boundary between the first groove portion and the second groove portion, like the shapes shown in FIGS. 6A to 6C. However, when comparing the upper part and the lower part of the entire groove, the shape is configured so that the lower part has a wider groove width. That is, the shape has a first groove portion (upper part) and a second groove portion 550 (lower part) wider than the first groove portion.

Here, from the viewpoint of suppressing the breakage of the step portion, the shape having the spherical side surface that is enlarged from the lower end of the first groove portion in the groove width direction and the rear surface direction, like the second groove portion 520 shown in FIG. 6A is more preferable than the shape shown in FIG. 6B formed by the linear side surfaces and bottom surface. This is because pressure, vibration or the like from a cutting member when a groove is formed on the rear surface side is easily dispersed without concentrating on corners. Further, in order to suppress remaining of the adhesive layer of the dicing tape generated when the dicing tape is separated, as the shape of the first groove portion, the vertical groove as shown in FIGS. 6A to 6C is preferable compared with the shape in which the width gradually increases from the front surface of the substrate toward the rear surface, as shown in FIG. 6D (reversed tapered shape). This is because the reversed tapered shape is a shape in which ultraviolet rays do not easily enter the inside of the adhesive layer, so that the adhesive layer is not easily cured, and even though the adhesive layer is cured, stress is easily applied to a root portion of the adhesive layer that enters the inside of the groove compared with the vertical shape to easily cause breakage.

Further, from the viewpoint of suppressing the remaining of the adhesive layer, as the shape of the side surface of the first groove portion, the shape in which the width gradually decreases from the front surface of the substrate toward the rear surface (forward tapered shape) is preferable compared with the vertical shape shown in FIGS. 6A to 6C. That is, it is preferable that the shape of the first groove portion is a shape that does not have a portion of which the width increases from the front surface of the substrate toward the rear surface side (reversed tapered shape). Further, when the shape is configured so that the width gradually decreases (forward tapered shape) from the front surface of the substrate toward the rear surface, from the viewpoint of suppressing the breakage of the step portion, it is necessary that the width of the second groove portion be a width larger than the lowermost part (lower end), instead of the width of the uppermost part (upper end) of the first groove portion. Details about the remaining of the adhesive layer will be described later.

The fine grooves 500, 500A, 500B, and 500C shown in FIGS. 6A to 6D are preferably configured to be line-symmetrical with respect to the center line orthogonal to the substrate. Further, in FIGS. 6A to 6D, the side surfaces of the fine groove are drawn by straight lines or curved surfaces for ease of description of characteristics of the fine groove, but it should be noted that steps or unevenness may be included on the side surfaces of the fine grooves that are actually formed and the corners are not strictly formed to have a right angle. Further, FIGS. 6A to 6D show exemplary shapes of the fine groove. Other shapes may be used as long as the shape is formed with the second groove portion having a width larger than the first width in the lower part that communicates with the first groove portion. For example, a shape obtained by combining the shapes that are respectively shown in FIGS. 6A to 6D or a shape obtained by deforming the shape after combination may be used.

Figure 7A:
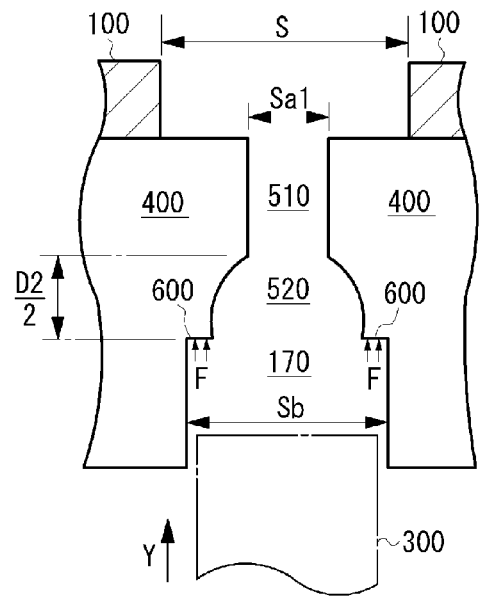
FIGS. 7A to 7D are diagrams illustrating an operation when a substrate on which a fine groove is formed is cut by a dicing blade, according to an embodiment of the invention.
Figure 7B:
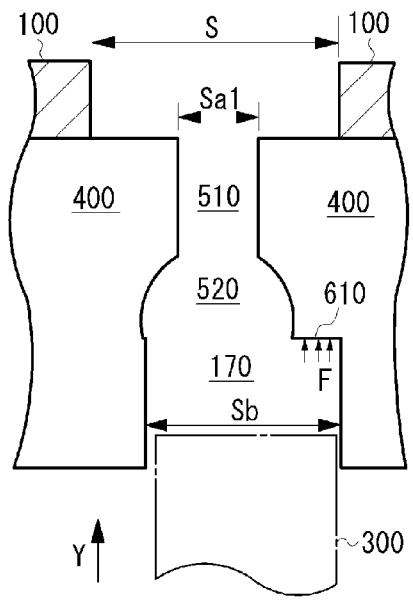

Next, an operation when the semiconductor substrate in which the fine groove of the present embodiment is formed is cut by a dicing blade will be described. FIGS. 7A and 7B show cutting examples of the semiconductor substrate in which the fine groove shown in FIG. 6A is formed. FIG. 7A is a cutting example when the center of the dicing blade 300 and the center of the second groove portion 520 are identical to each other and the positional shift between the centers does not occur, and FIG. 7B is a cutting example when the positional shift between the centers occurs. Further, the kerf width Sb due to the dicing blade is larger than the maximum value of the width Sa2 of the second groove portion 520 of the fine groove (Sa2<Sb).

As shown in FIG. 7A, when the groove 170 is formed on the rear surface of the substrate by the dicing blade 300, the groove 170 is connected to the second groove portion 520.

Here, the dicing blade 300 is positioned in the direction orthogonal to the substrate (thickness direction of the substrate) so that the tip portion thereof passes through the inside of the depth range D2 at which the second groove portion 520 is formed, and in this state, the cutting operation is advanced in the direction parallel to the substrate. For example, the tip portion of the dicing blade 300 passes through the vicinity of the position where the width Sa2 of the second groove portion 520 becomes maximum, that is, the vicinity of the position where the width Sa2 becomes the depth D2/2 of the second groove portion 520. In other words, the dicing blade 300 is positioned in the direction orthogonal to the substrate (thickness direction of the substrate) so that the tip portion is identical to the position where the width Sa2 of the second groove portion 520 becomes maximum, and in this state, the cutting operation is advanced in the direction parallel to the substrate.

When the width (kerf width Sb) of the groove 170 is approximately the same as the thickness of the dicing blade 300 and the positional shift does not occur in the dicing blade 300, a step 600 that extends inside the groove 170 is formed at the boundary between the groove 170 and the second groove portion 520. Since the width of the step 600 becomes small compared with a case where the second groove portion 520 is not formed and the shape of the first groove portion is present, the contact area between the tip portion of the dicing blade 300 and the step 600 is small, and thus, the force applied to the step 600 from the dicing blade decreases. As a result, when the stress applied to the step portion 400 through the step 600 decreases, and thus, when the groove 170 of the same depth is formed on the rear surface side, the breakage of the step portion 400 is suppressed. On the other hand, as shown in FIG. 7B, when the positional shift of the dicing blade 300 occurs, a step 610 having a relatively large width on one side of the second groove portion 520 may be formed, but in this case, similarly, since the width of the step 610 can be made small compared with a case where the second groove portion 520 is not formed, it is possible to suppress the breakage of the step portion 400.

Figure 7C:
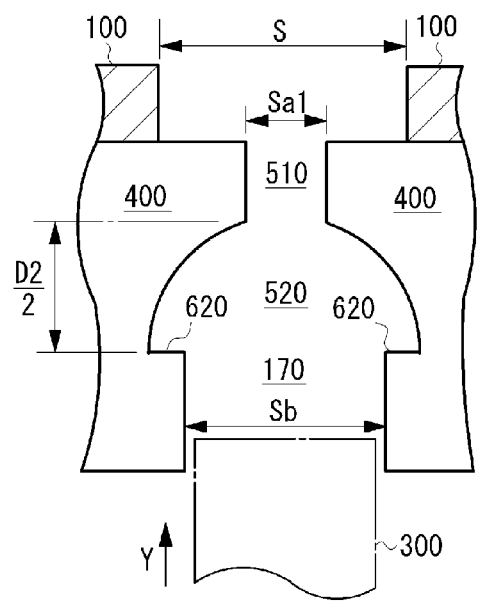
Figure 7D:
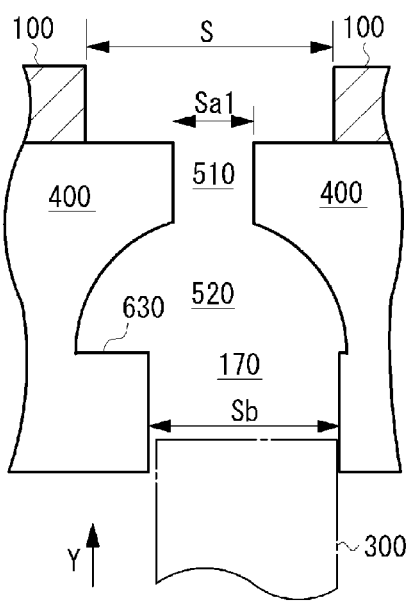

FIGS. 7C and 7D show cutting examples when the width Sa2 of the second groove portion 520 is larger than the kerf width Sb. The typical kerf width Sb of the dicing blade 300 is about 20 µm to about 60 µm, and at least a part of the second groove portion 530 includes the width Sa2 larger than the kerf width Sb. FIG. 7C shows ideal cutting in which the positional shift does not occur between the second groove portion 520 and the dicing blade. In this case, the step that extends inside the groove 170 is not formed, and instead, a step 620 that extends outside the groove 170 is formed. Thus, the tip portion of the dicing blade 300 does not come into contact with the step 620, and thus, the force from the dicing blade 300 is not transmitted to the step 620, so that the breakage of the step portion 400 is suppressed.

As shown in FIG. 7D, even when the positional shift occurs in the dicing blade 300 due to the accuracy of a manufacturing apparatus, if the amount of the positional shift is equal to or smaller than a value of (Sa2−Sb)/2, a step 630 that extends outside the groove 170 is formed. Thus, the stress is not applied to the step portion 400 from the dicing blade 300 through the step 630. Even if the positional shift amount is greater than (Sa2−Sb)/2, since the width of the step is small compared with a case where the second groove portion 520 is not formed, the stress to the step portion 400 is reduced. The above cutting example uses the fine groove 500 shown in FIG. 6A as a target, but the same effect can be similarly obtained using the fine grooves as shown in FIGS. 6B to 6D.

Next, the depth of the groove on the rear surface side will be described. In FIGS. 7A to 7D, the groove 170 on the rear surface side is formed to have a depth that reaches the second groove portion 520 but does not reach the first groove portion 510. This is because if the groove 170 on the rear surface side is cut until it reaches the first groove portion 510, the contact area between the dicing blade 300 and the step 600 becomes the same compared with a case where the second groove portion 520 is not formed, and thus, the effect of suppressing the breakage of the step portion 400 is not achieved. Accordingly, it is preferable that the depth of the groove 170 on the rear surface side is formed to have the size of reaching the second groove portion 520 but does not reach the first groove portion 510. In other words, it is preferable that the dicing blade 300 is positioned to form the groove 170 on the rear surface side that reaches the second groove portion 520 but does not exceed the lowermost part (lower end) of the first groove portion 510.

Further, when the second groove portion does not have a uniform width, for example, like the shape shown in FIG. 6A, when the second groove portion has a shape having a portion of which the width increases from the lowermost part of the first groove portion 510 and a portion of which the width decreases in the lower part thereof, the width Sa2 becomes maximum between the width increasing portion and the width decreasing portion, and the width of the step 600 in the horizontal direction becomes minimum at this position. In such a shape, since the thickness of the step portion 400 gradually decreases from a depth where the dicing blade 300 reaches the second groove portion to a depth where the width Sa2 becomes maximum, the strength of the step portion 400 is weakened, but the width of the step 600 decreases, and thus, the applied force decreases. On the other hand, since the thickness of the step portion 400 gradually decreases from the depth where the width Sa2 becomes maximum to the lowermost part of the first groove portion 510, the strength of the step portion 400 is weakened, and also, the width of the step 600 increases. Thus, the applied stress increases. That is, if the depth of the groove 170 on the rear surface side formed by the dicing blade 300 exceeds the depth where the width Sa2 becomes maximum, the step portion 400 is easily broken. Accordingly, it is preferable that the depth of the groove 170 on the rear surface side is formed to have the depth that reaches the second groove portion 520 but does not exceed the depth where the width of the second groove portion becomes maximum. In order to form such a groove, the dicing blade 300 is positioned at the position where the groove 170 on the rear surface side reaches the second groove portion 520 but does not exceed the depth where the width of the second groove becomes maximum, and in this state, the cutting operation is advanced in the direction parallel to the substrate.

Further, the depth of the groove on the rear surface side will be described. The depth of the groove on the rear surface side formed by the dicing blade varies in the thickness direction of the substrate due to the accuracy of a dicing apparatus (cutting apparatus) to be used in the thickness direction of the substrate or abrasion of the dicing blade. Even in this case, it is preferable that the depth of the groove on the rear surface side is formed to reach the second groove portion but does not reach the first groove portion. In other words, it is preferable that the depth from the upper end of the second grove portion to the lower end thereof is a height including a range where the depth of the groove on the rear surface side varies due to the accuracy of the cutting apparatus to be used in the thickness direction of the substrate. Further, even when the depth of the groove on the rear surface side varies, it is preferable that the groove on the rear surface side is formed to reach the second groove portion but does not exceed the depth where the depth of the second groove becomes maximum. In order to reliably realize this relationship, it is preferable to detect a range where the depth of the groove on the rear surface side varies, and to form the groove on the rear surface side in consideration of the detected range. Thus, the breakage of the step portion can be suppressed, compared with a case where the accuracy of the manufacturing apparatus to be used or the abrasion of the dicing blade is not considered.

Further, it is preferable that the height from the upper end of the second groove portion to the lower end thereof is a height including a range where the depth of the groove on the rear surface side varies due to the abrasion of the dicing blade from the time when the dicing blade starts cutting a single substrate to the time when the cutting of the single substrate is completely finished. In other words, it is preferable that the dicing blade that satisfies the above relationship is positioned. According to such a relationship, the depth of the groove on the rear surface side does not protrude from the second groove portion due to the abrasion of the dicing blade while the single substrate is being cut, and it is not necessary to change the positioning in the thickness direction of the substrate while the substrate is being cut in order to prevent the protrusion.

Figure 8A:
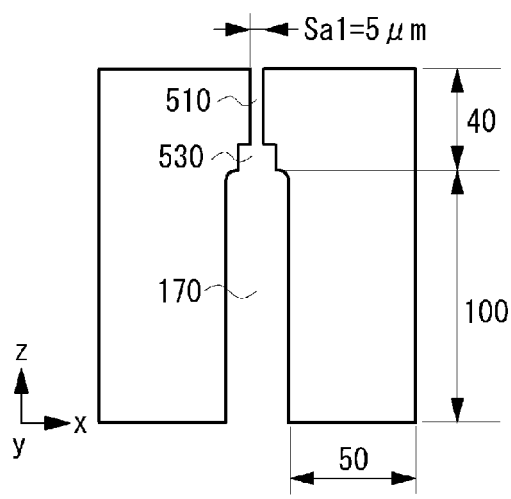
FIGS. 8A and 8B are examples of analysis models used in a stress simulation.
Figure 8B:
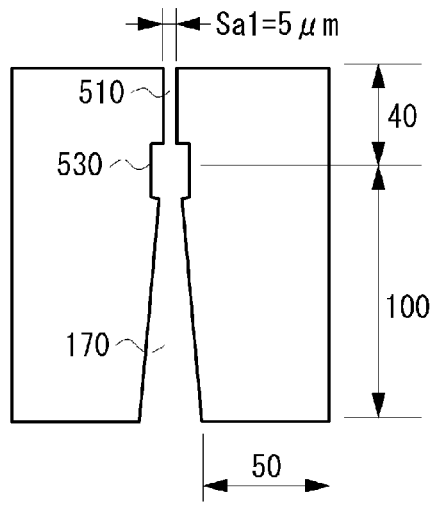
Figure 8C:
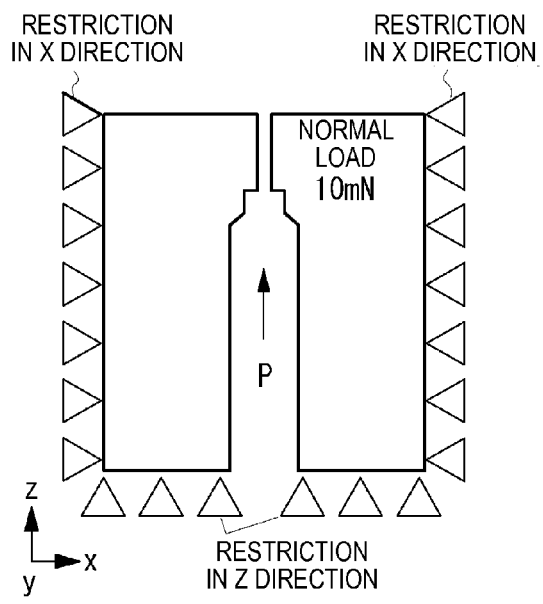
FIGS. 8C and 8D are diagrams illustrating an analysis condition.
Figure 8D:
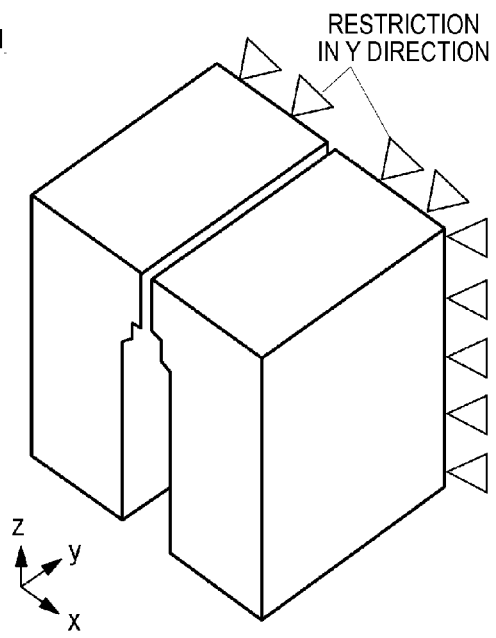

Next, a stress simulation applied to the step portion of the present embodiment will be described. FIGS. 8A and 8B illustrate analysis models. In the analysis models of FIGS. 8A and 8B, the second groove portion 530 of a rectangular shape with a wide width is formed in the fine groove 500A as shown in FIG. 6B, that is, a fine groove portion 500A. It is assumed that the width Sa1 of the first groove portion 510 of the fine groove is 5 µm, the second groove portion 530 of the rectangular shape with the wide width is 15 µm, the cutting position of the dicing blade (distance from the front surface of the substrate) is 40 µm, and the length of the substrate W in the horizontal direction when the cutting is performed by the dicing blade is 50 µm. Further, as a comparative example, a fine groove (straight groove) where the bottom is not enlarged, as shown in FIG. 5B, is used as an analysis target. As the dicing blade, two types of a dicing blade (dicing blade 1) having a uniform kerf width Sb as shown in FIG. 8A and a dicing blade (dicing blade 2) where the kerf width Sb becomes narrower toward the tip as shown in FIG. 8B are prepared. Normally, even though the shape of the dicing blade 1 is maintained in an initial state, the dicing blade 1 is abraded due to long-time use, to that the tip portion is changed to a shape like the dicing blade 2. As an analysis condition, as shown in FIGS. 8C and 8D, the substrate W is restricted in the X direction, the Y direction, and the Z direction restriction, and 10 mN as load P is applied to the groove formed by the dicing blade. Then, stress distribution with respect to the substrate W is calculated by a stress simulation. Further, the stress simulation is performed on a condition that the positional shift amount (positional shift amount in the X axis direction with respect to the center of the first groove portion 510 of the fine groove) of the dicing blade is 0, 2.5 µm, 5 µm, and 7.5 µm.

Figure 9:
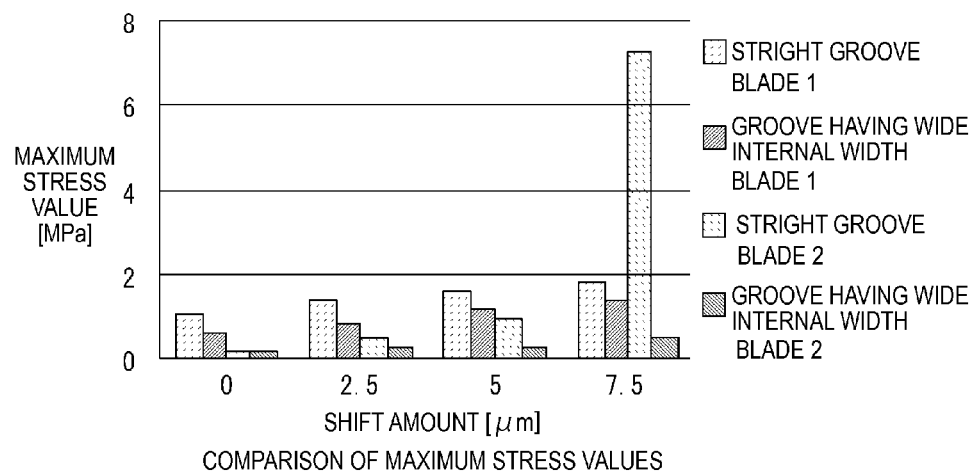
FIG. 9 is a graph illustrating a stress simulation result.

FIG. 9 is a graph illustrating an analysis result of the stress simulation. When comparing the related art straight fine groove (groove that has the uniform groove width and does not include the second groove portion) with the fine groove having the wide internal width of the present embodiment (groove having the second groove portion), it can be understood that the fine groove having the wide internal width of the present embodiment has a small maximum stress value occurring in the step portion in both of the dicing blade 1 and the dicing blade 2. Further, it can also be understood that the dicing blade 2 in which the kerf width is the tapered shape, that is, the width becomes narrow toward the tip has a small maximum stress value in the fine groove having the same wide internal width.

If the positional shift increases to 7.5 µm, the maximum stress value rapidly increases when the straight fine groove is cut by the dicing blade 2. This means that in the case of the dicing blade 2 having the tapered tip, when the tip portion (top portion) of the dicing blade is out of the range of the width Sa of the groove shown in FIG. 5B, stress concentrates on the top portion of the dicing blade, and thus, stress applied to the substrate rapidly increases. On the other hand, in the case of the fine groove having the wide internal width of the present embodiment, it can be understood that even though the positional shift increases to 7.5 µm, the tapered tip is present in the fine groove having the wide internal width, and thus, the maximum stress value does not rapidly increase. From the stress simulation result, although if shift between the center of the fine groove and the center of the dicing blade increases, the breakage easily occurs in the step portion due to the stress concentration, in the case of the fine groove having the configuration with the wide bottom according to the present embodiment, even though the positional shift increases, the stress concentration is easily alleviated, and thus, the breakage of the step portion is suppressed. Even in the wide internal width, when the top portion of the dicing blade is deviated from the range, stress concentrates on the deviated portion, and breakage easily occurs, compared with a case where the deviation does not occur. Further, in both of the straight fine groove or the fine groove having the wide internal width, when the top portion of the dicing blade having the tapered tip is deviated from the range and stress that exceeds the strength of the semiconductor piece (substrate) is applied, fragment occurs from the vicinity of a position that comes into contact with the top portion toward the fine groove side or the front surface of the semiconductor piece (substrate), which causes chap, crack or the like.

Here, in an actual mass production process, whether the tip portion (top portion) of the dicing blade of the tapered shape is out of the range of the width Sa of the groove 140 shown in FIG. 5B is determined by the relationship between the accuracy of the manufacturing apparatus and the width Sa of the groove, and the accuracy of the manufacturing apparatus is determined by the processing accuracy of the dicing apparatus, the accuracy of detecting means (camera or the like) for detecting the position of the fine groove on the front surface side, or the like. Accordingly, as a manufacturing condition in the actual mass production process, when the relationship between the accuracy of the manufacturing apparatus and the width Sa of the groove is satisfied so that the tip portion (top portion) of the dicing blade is out of the range of the width Sa of the groove 140 in FIG. 5B, it is effective that the top portion is positioned in the range of the groove width by employing the structure shown in FIGS. 6A to 6D. That is, when the width where the position of the top portion of the cutting member varies in the groove width direction is large due to the accuracy of the manufacturing apparatus to be used compared with the width of the Sa1 shown in FIGS. 6A to 6D, it is preferable that Sa2 is a width including the entire width where the position of the top portion of the cutting member varies in the groove width direction due to the accuracy of the manufacturing apparatus to be used. By setting the width of Sa2 in this way, even though the tip portion of the dicing blade has the tapered shape, the breakage of the semiconductor piece is suppressed. The top portion of the dicing blade is a part of the tip of the dicing blade, which may be a single point (apex), or may be a surface (top face). When the top portion is the surface, it is preferable that the entire surface is included in the groove. Further, when the tip forms a concave shape due to partial abrasion and plural top portions are formed, it is preferable that the entirety is included in the groove. In addition, normally, since the top portion of the dicing blade is usually formed at the center of the dicing blade in the thick direction, it is preferable that Sa2 is a width where the center of the cutting member in the thickness direction varies in the groove width direction due to the accuracy of the manufacturing apparatus. With such a relationship, even though the tip of the dicing blade is abraded to form the tapered shape, the breakage of the step portion is suppressed.

Figure 10:
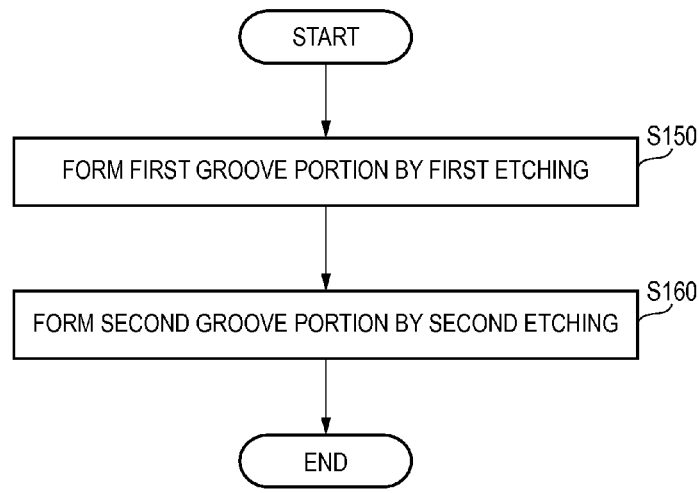
FIG. 10 is a diagram illustrating the flow of a first manufacturing method for forming a fine groove according to an embodiment of the invention.

Next, a manufacturing method of the fine groove of the present embodiment will be described. FIG. 10 is a flowchart illustrating a first manufacturing method for manufacturing the fine groove of the present embodiment. The fine groove as shown in FIGS. 6A to 6D includes a process of forming the first groove portion having the width Sa1 by first etching (S150), and a process of forming the second groove portion having the width Sa2 wider than the width Sa1 on the lower side of the first groove portion by second etching (S160). Here, the second etching uses etching having a strong etching strength in the side wall direction compared with the first etching. For example, an example in which anisotropic etching is used as the first etching and isotropic etching is used as the second etching will be described.

Figure 11A:
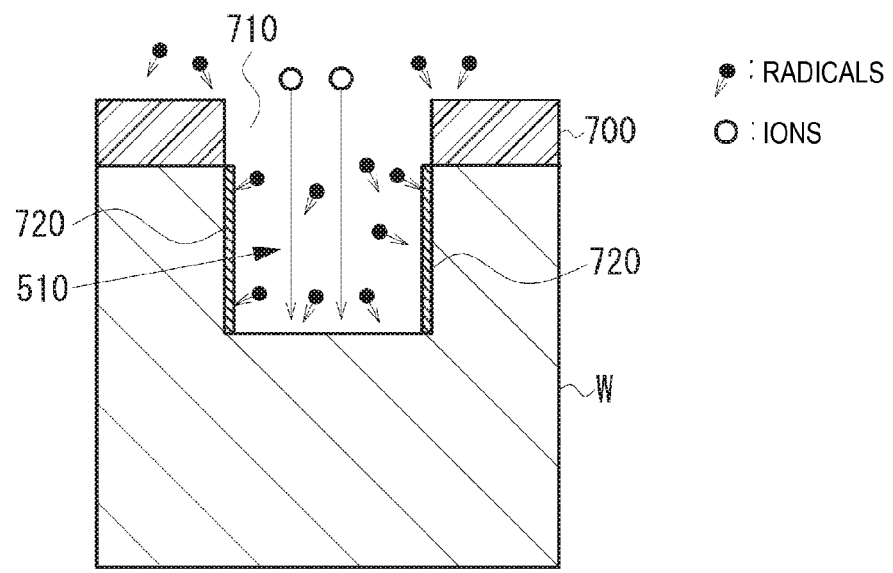
FIGS. 11A and 11B are cross-sectional views schematically illustrating a process of manufacturing a fine groove of a flask shape by the first manufacturing method according to the embodiment of the invention.
Figure 11B:
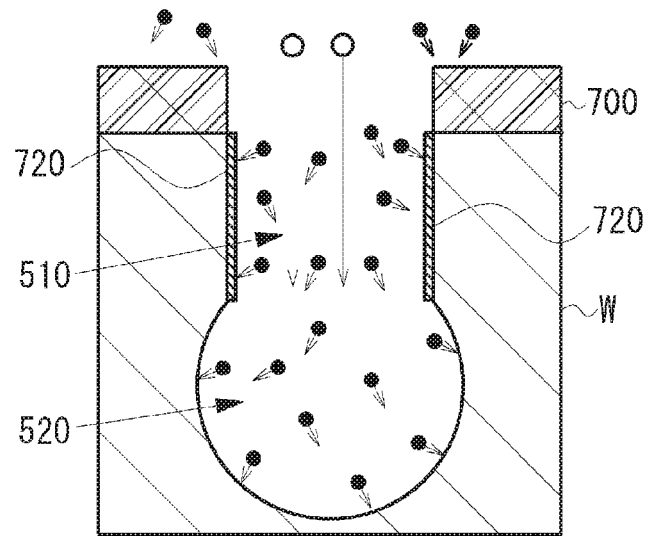

FIGS. 11A and 11B are schematic cross-sectional views illustrating a manufacturing process of the fine groove 500 shown in FIG. 6A. A photo resist 700 is formed on the front surface of a GaAs substrate W. The photo resist is an i-line resist having a viscosity of 100 cpi, and is coated to have a thickness of about 8 μm. An opening 710 is formed in the photo resist 700 using a known photolithography process, for example, using an i-line stepper and a developer of TMAH 2.38%. The width of the opening 710 defines the width Sa1 of the first groove portion.

A first groove portion 510 is formed on the front surface of the substrate using the photo resist 700 as an etching mask. In a preferred embodiment, inductive coupled plasma (ICP) is used as a reactive ion etching (RIE) apparatus. As an etching condition, for example, inductive coupled plasma (ICP) power is 500 W, bias power is 50 W, and pressure is 3 Pa. As etching gases, $Cl_2$ is 150 sccm, $BCl_3$ is 50 sccm, and $C_4F_8$ is 20 sccm. Further, an etching time is 20 minutes. As known in the art, by adding a CF-based gas, a protective film 720 is formed on the side wall at the same time with etching. Radicals and ions are generated by reactive gas plasma. The side wall of the groove is attacked by only the radical, but is not etched due to the presence of the protective film 720. On the other hand, the protective film of the bottom portion is removed by vertically incident ions, and the removed portion is etched by the radicals. Thus, anisotropic etching is achieved.

Next, by changing the etching condition, isotropic etching is performed. For example, here, the supply of $C_4F_8$ that functions to form the protective film 720 on the side wall is stopped. Inductive coupled plasma (ICP) power is 500 W, bias power is 50 W, and pressure is 3 Pa. As etching gases, $Cl_2$ is 150 sccm, and $BCl_3$ is 50 sccm. Further, an etching time is 10 minutes. As the supply of $C_4F_8$ is stopped, since the protective film 720 is not formed on the side wall, the isotropic etching is achieved in the bottom portion of the first groove portion 510. Thus, the second groove portion 520 is formed on the lower side of the first groove portion 510. The second groove portion 520 has a spherical side and bottom surface that extends in the transverse and lower directions from the width Sa1 of the first groove portion 510. The above-mentioned etching condition is only an example, and the etching condition may be appropriately changed according to the width, the depth, the shape or the like of the fine groove.

The shape shown in FIG. 6C may be formed by weakening the etching strength in the side wall direction when the second groove portion is formed, compared with a case where the second groove portion in FIG. 6A is formed. The etching strength in the side wall direction may be changed by changing the etching condition such as an output of the etching apparatus or an etching gas. Specifically, for example, the supply of $C_4F_8$ which is the side wall protection gas may be reduced compared with the flow rate when the first groove portion is formed, instead of being completely stopped, or the flow rate of $Cl_2$ or the like which is the etching gas may be increased. Alternatively, these two methods may be combined. In other words, such a shape may be formed by supplying both of the side wall protection gas and the etching gas included in the etching gas and by changing the respective flow rates, when the first groove portion is formed, and when the second groove portion is formed. Further, by setting the flow rates in advance before the first groove portion is formed, the first groove portion and the second groove portion may be formed by a series of continuous etching processes. When the first groove portion is formed in the shape in which the width gradually decreases from the front surface of the substrate to the rear surface (forward tapered shape) in order to suppress the remaining of the adhesive layer, the flow rate of $C_4F_8$ or $Cl_2$ or the output of the etching apparatus may be appropriately adjusted or the flow rates may be appropriately changed so that such a shape can be formed. Further, the shape as shown in FIG. 6D may be formed when the first groove portion in FIG. 6C is not formed. In addition, such etching is generally achieved as anisotropic etching.

Figure 12:
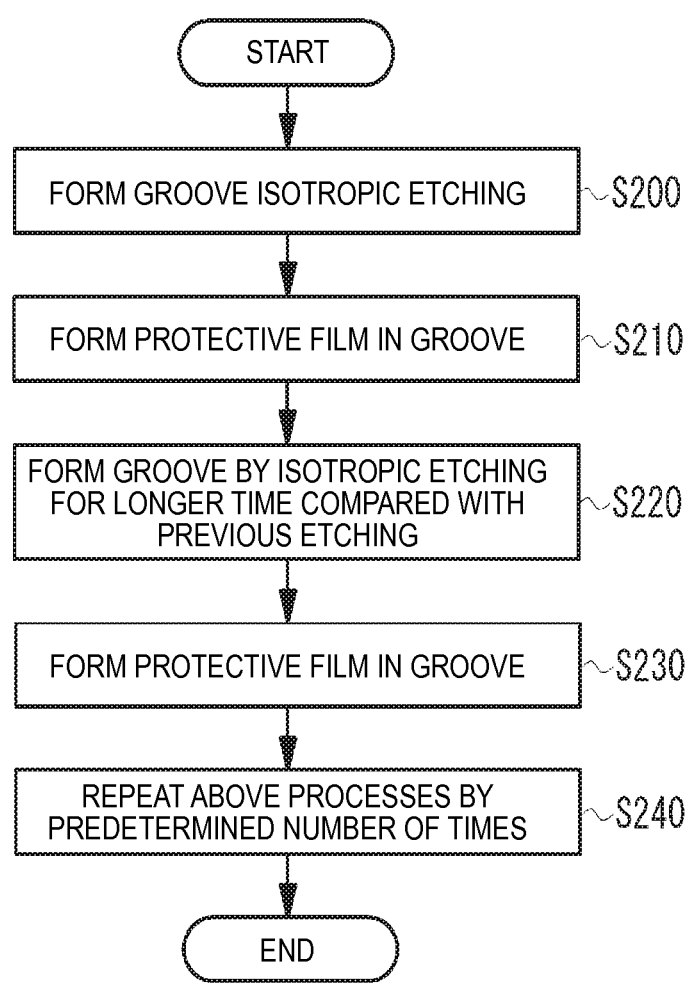
FIG. 12 is a diagram illustrating the flow of a second manufacturing method for forming a fine groove according to an embodiment of the invention.

Next, FIG. 12 shows a flowchart of a second manufacturing method for manufacturing the fine groove of the present embodiment, and FIGS. 13A to 13E show schematic cross-sectional views of the second manufacturing process of the fine groove.

First, similar to the first manufacturing method, as shown in FIG. 13A, a photo resist 800 is formed on the front surface of the substrate. As shown in FIG. 13A, an opening 810 for etching a fine groove is formed in the photo resist. Then, a first groove 820 having a predetermined depth is formed on the front surface of the substrate using the photo resist 800 as a mask by first isotropic etching (S200). The first isotropic etching is performed by the same etching condition as in the isotropic etching of the first manufacturing method, for example.

Then, as shown in FIG. 13B, a first protective film 830 is laminated on the side wall and bottom portion of the first groove 820 (S210). The first protective film 830 is made of a CF-based polymer, for example, and is formed by changing only the gas to $C_4F_8$ compared with the first isotropic etching.

Then, second isotropic etching is performed (S220). Similar to the first isotropic etching, the second isotropic etching is performed by an etching gas that does not include $C_4F_8$. The second isotropic etching is performed under an etching condition capable of forming a groove having a wide width compared with the first isotropic etching. For example, the second isotropic etching is performed for a long time compared with the first isotropic etching. In an initial stage of the second isotropic etching, as shown in FIG. 13C, the bottom portion of the first protective film 830 is etched and removed by ions, and thus, the bottom portion is exposed. Further, for example, by lengthening the second isotropic etching compared with the first isotropic etching, as shown in FIG. 13D, a deep second groove 840 that is enlarged in the transverse direction is formed on a lower side of the first groove 820.

After the second isotropic etching is finished, as shown in FIG. 13E, a second protective film 850 is formed on the side wall and bottom portion of the first groove 820 and the second groove 840 (S230). The formation of the second protective film 850 is performed under the same condition as in the formation of the first protective film shown in FIG. 13B. The fine groove on the front surface having the first groove portion and the second groove portion having the width greater than that of the first groove portion is formed by the first and second isotropic etchings and the first and second protective film formation processes. The first and second isotropic etchings and the first and second protective film formation processes are continuously repeated plural times (S240), so that a fine groove of a reversed tapered shape can be formed.

Hereinbefore, the manufacturing methods for forming the fine groove of the present embodiment are described, but other methods may be used as long as the first groove portion and the second groove portion having the width greater than that of the first groove portion can be formed. For example, a combination of dry etching and wet etching may be used. Further, it is not necessary that the first groove portion be formed only by the first etching, and that the second groove portion be formed only by the second etching. That is, if the first etching is main etching with respect to the first groove portion, etching other than the first etching may be included, and if the second etching is main etching with respect to the second groove portion, etching other than the second etching may be included. Further, since it is sufficient if at least the first groove portion and the second groove portion are formed, for example, a third groove portion or a fourth groove portion may be present between the first groove portion and the second groove portion or at a position close to the rear surface side of the substrate with reference to the second groove portion, which may be formed by third etching or fourth etching.

Further, appropriate use of the isotropic etching and the anisotropic etching may be performed as follows, for example. That is, if the first groove portion is formed by the anisotropic etching instead of the isotropic etching, the first groove portion can easily form a narrower groove, and if the narrower groove can be formed, the number of semiconductor pieces capable of being obtained from a single substrate increases. Further, if the second groove portion is formed by the isotropic etching, the second groove portion easily form a wider groove compared with the case of the anisotropic etching, and if the wider width can be formed, variation of the dicing blade in the groove width direction is easily allowed. On the other hand, if the second groove portion is formed by the anisotropic etching, the second groove portion easily form a deeper groove compared with the case of the isotropic etching, and if the deeper groove can be formed, the thickness of the step portion can increase, so that the strength of the step portion 400 increases. As described above, an etching method may be selected so that the step portion 400 is not easily broken in consideration of conditions such as a substrate material that is a processing target and the accuracy of an apparatus to be used.

Next, the remaining of the adhesive layer when a dicing tape is separated will be described. In a cutting line A2 shown in FIG. 14, vibration B and cut pressure P are applied to the semiconductor substrate W through inner walls of the groove 170 by rotation of the dicing blade 300 or relative movement of the dicing blade 300 and the semiconductor substrate W while the semiconductor substrate W is being cut. If the semiconductor substrate W is pressed in the Y direction by the cut pressure P, a viscous adhesive layer 164 flows into the fine groove 140. Further, as the vibration B is transferred to the vicinity of the fine groove 140, the flow of the adhesive layer 164 is promoted. Further, in cutting using the dicing blade 300, a cutting water stream (jet water stream) mixed with chips is supplied to the groove 170, and pressure P1 is applied in a direction where the fine groove 140 is expanded by the cutting water stream. Thus, the entrance of the adhesive layer 164 is further promoted. For example, the adhesive layer 164 can enter the depth of about 10 μm when the fine groove 140 has a width of about 5 μm.

In a cutting line A1 where the dicing is finished, since pressure is applied during cutting of the adjacent cutting line A2 so that the fine groove 140 is narrowed in the width direction, it is considered that the adhesive layer 164 that enters the fine groove 140 easily enters further inside. In a cutting line A3 on an opposite side before cutting, since the adhesive layer 164 is merely attached, it is considered that the amount of entrance of the adhesive layer 164 into the fine groove 140 is relatively small.

Figure 15:
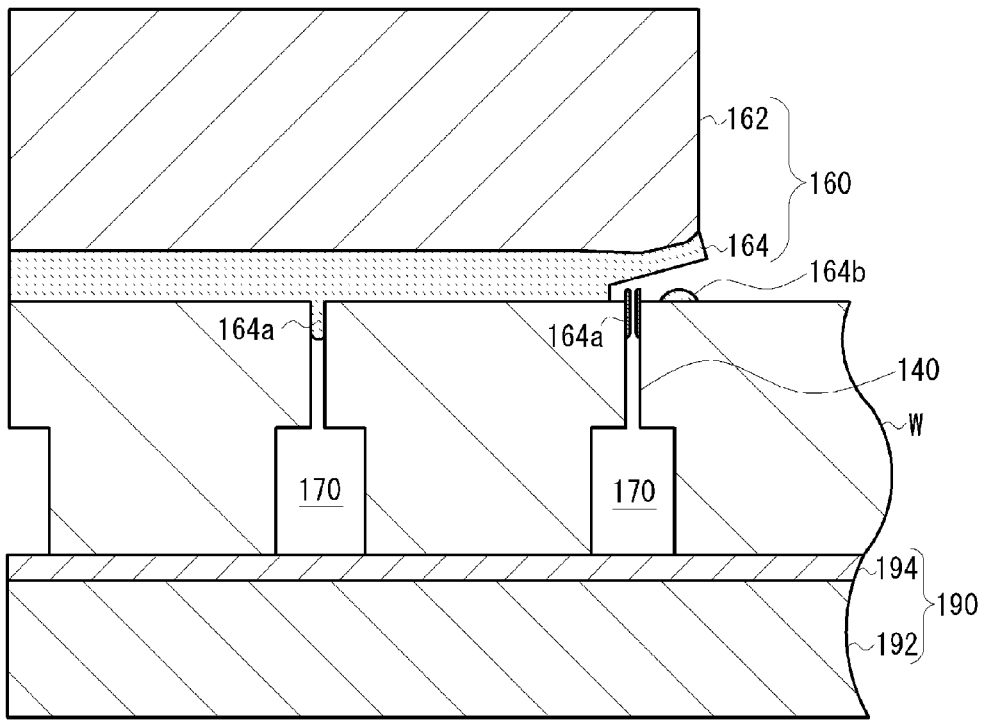
FIG. 15 is a cross-sectional view illustrating remaining of an adhesive layer when a dicing tape is separated from a substrate surface.

If the half dicing using the dicing blade 300 is finished, an expansion tape 190 is attached to the rear surface of the substrate, and then, a dicing tape 160 is irradiated with ultraviolet rays 180. The adhesive layer 164 irradiated with the ultraviolet rays is cured, and the viscosity is lost (see FIG. 3D). Then, the dicing tape is separated from the front surface of the substrate. FIG. 15 is a cross-sectional view illustrating the remaining of the adhesive layer when the dicing tape is separated. The expansion tape 190 includes a tape base material 192 attached to the rear surface of the substrate and an adhesive layer 194 stacked thereon, and the cut semiconductor pieces are held by the adhesive layer 194.

Here, when the shape of the fine groove 140 is the reversed tapered shape in which the width gradually increases immediately from the position of the front surface of the substrate, as shown in FIG. 6D, compared with the vertical shapes shown in FIGS. 6A to 6C where the first groove portion that does not have the reversed tapered shape is present, a part of a adhesive layer 164a that enters the fine groove is not sufficiently irradiated with ultraviolet rays, and is easily uncured. Since the uncured adhesive layer 164 has viscosity, when the adhesive layer 164 is separated from the front surface of the substrate, the uncured adhesive layer 164a may be cut, so that the adhesive layer 164a may remain inside the fine groove 140, or may be re-attached to the front surface of the substrate to be remained. Further, even though the adhesive layer 164a is in a cured state, since the adhesive layer 164a deeply intrudes into the narrow fine groove, the adhesive layer 164a may be broken due to stress during removal to be remained. If a remaining adhesive layer 164b is attached to the front surface of the light emitting device again, it causes reduction of the light intensity of the light emitting device. Thus, the light emitting device becomes a defective product, which results in reduction of a yield rate.

Further, even in a semiconductor chip other than the light emitting device, as the adhesive layer 164b remains, other negative influences are expected. For example, it may be determined that the chip is defective by visual inspection or the like. Thus, when the dicing tape is separated, it is not preferable that the adhesive layers 164a and 164b remain on the front surface of the substrate. That is, in order to suppress the remaining of the adhesive layer of the dicing tape occurring when the dicing tape is separated, it is preferable that the shape of the first groove portion is the vertical groove as shown in FIGS. 6A to 6C, compared with the reversed tapered shape in which the width gradually increases immediately from the position of the front surface of the substrate. Further, from the viewing of suppressing the remaining of the adhesive layer, it is more preferable that the shape of the first groove portion is a shape (forward tapered shape) in which the width gradually decreases from the front surface of the substrate toward the rear surface thereof, compared with the vertical shapes in FIGS. 6A to 6C. That is, from the viewpoint of suppressing the remaining of the adhesive layer, it is preferable that the shape of the first groove portion is a shape that does not have the portion (reversed tapered shape) of which the width increases from the front surface of the substrate toward the rear surface thereof. Further, if the shape of FIG. 6C is employed, it is preferable that the sidewall of the fine groove 500b does not have an edge portion but has a smoothly curved sidewall. In FIG. 6C, an angle of the sidewall is abruptly changed at the depth D. In other words, the sidewall of the fine groove 500b has the edge portion at the depth D. However, if the sidewall of the fine groove 500b does not have an edge portion, the adhesive layer 164 is more smoothly extracted from the fine groove 500b even if the adhesive layer 164 enters more deeply than the depth D.

When the plural light emitting devices 100 are formed in a mesa shape, each light emitting device 100 forms a convex portion, and a space between the light emitting devices 100 forms a concave portion. In many cases, the fine groove 140 is formed in the concave portion. In such a configuration, a configuration in which a cutting water stream mixed with chips does not intrude into the front surface side of the substrate by attaching the adhesive layer 164 to follow an inlet portion of the fine groove 140 formed in the concave portion 140 in addition to the convex portion may be considered. Here, in order to allow the adhesive layer 164 to follow the inlet portion of the fine groove 140, a dicing tape having the adhesive layer 164 of a sufficient thickness is necessary, and thus, the adhesive layer 164 easily and deeply enters the fine groove 140. Accordingly, in a condition that the adhesive layer 164 easily and deeply enters the fine groove 140, it is preferable that the shape of the first groove portion is the shape that does not have the portion (reversed tapered shape) of which the width increases from the front surface of the substrate to the rear surface.

Further, when the fine groove that is vertical from the front surface of the semiconductor substrate is formed, and when the adhesive layer 164 intrudes more deeply than the distance of the groove width of the fine groove, that is, when the shape of the adhesive layer 164a in the fine groove 164a, of the adhesive layer 164, is longitudinally long, compared with a case where the shape is not longitudinally long, it is considered that the adhesive layer 164a is easily broken due to stress applied to a root portion of the adhesive layer 164a in the fine groove, when the adhesive layer 164 is separated, to be easily remained therein. Accordingly, in a manufacturing condition such as the width of the fine groove or the thickness of the adhesive layer 164 in which the shape of the adhesive layer 164a in the fine groove is longitudinally long, it is preferable that the shape of the first groove portion is the shape that does not have the portion (reversed tapered shape) of which the width increases from the front surface of the substrate to the rear surface.

Further, it is preferable that the depth D1 of the first groove in FIGS. 6A to 6C is a depth that maintains a state where the adhesive layer 164 does not intrude into a groove portion deeper than the depth D1 after the groove on the rear side is formed by the dicing blade. This is because since the angle of the side surface of the groove is changed at the boundary between the first groove portion and the second groove portion, when the adhesive layer 164 intrudes into the groove portion deeper than the depth D1, curing becomes difficult, and breakage easily occurs due to stress applied during removal. Preferably, the depth D is 10 µm or more. Hereinbefore, the preferable embodiments in which the remaining of the adhesive layer is suppressed have been described, but the remaining of the adhesive layer is suppressed if the embodiments contribute to suppression of the remaining of the adhesive layer, regardless of the degree of suppression.

Figure 16:
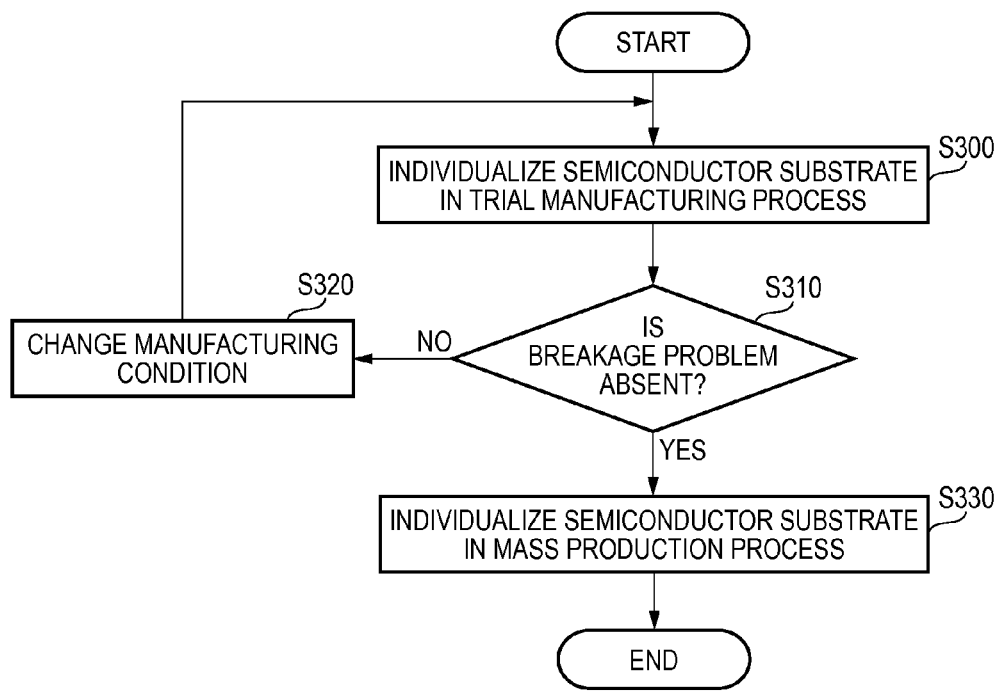
FIG. 16 is a flowchart illustrating another example of the semiconductor piece manufacturing process according to an embodiment of the invention.

FIG. 16 is a flowchart illustrating another example of a semiconductor piece manufacturing method according to an embodiment of the invention. FIG. 16 is a flowchart illustrating an entire manufacturing process including preparation (design method) before the series of manufacturing methods shown in FIG. 1 are performed in a mass production process. First, in a trial manufacturing process, a semiconductor substrate is individualized according to the flowchart shown in FIG. 1 (S300). Here, it is not necessary to completely individualize the semiconductor substrate, and it is sufficient if the procedure advances to at least a process capable of checking the degree of breakage of semiconductor pieces (the degree of breakage of the vicinity of the fine groove on the front surface side, such as a step portion). Then, the degree of breakage of the semiconductor piece is checked to determine whether the problem is absent (S310). Here, it is preferable that the breakage is not present at all, but even though the breakage is present, it may be determined that there is no problem if the breakage is present to a degree that is allowable in mass production. For example, if the breakage is a minute defect that does not affect electric characteristics of the semiconductor piece, it may be determined that there is no problem. Further, it is preferable that the presence or absence of the problem is determined based on a large amount of results obtained by processing plural substrates. Then, if it is determined that there is no problem (YES in S310), the manufacturing condition is used as a manufacturing condition in mass production (S330). If it is determined that there is the problem (NO in S310), the manufacturing condition is changed (S320). Here, the manufacturing condition refers to a manufacturing condition that affects the degree of breakage, and the "vicinity" of the vicinity of the fine groove refers to a region where breakage occurs in the semiconductor piece due to stress from the dicing blade.

In S320, the manufacturing condition is changed to suppress the breakage. For example, the manufacturing condition is changed so that the width of the second portion becomes a greater width. This is achieved by changing the condition of the second etching so that the width of the second groove portion becomes the greater width. Specifically, the etching condition such as setting of an etching gas or an etching apparatus is changed so that the etching strength in the side wall direction of the groove in the second etching increases. For example, when the second groove portion of the fine groove on the front surface side of the substrate is formed by isotropic etching, it is preferable that the time of the isotropic etching is lengthened. Further, when the second groove portion is formed by anisotropic etching, the flow rate of $Cl_2$ which is an etching gas included in the etching gas may be increased, and the flow rate of $C_4F_8$ (CF-based gas) which is a gas for forming a side wall protective film may be decreased. This is achieved by changing at least one of the flow rates. In addition, by changing the output of the etching apparatus, for example, the etching condition may be changed to enlarge the groove width. Even when the width of the second groove portion is greater than the width of the groove on the rear surface side, by changing the etching condition so that the second groove portion of the greater width is obtained, it is possible to suppress the breakage of the semiconductor chip, compared with a case where the etching condition is not changed.

After the manufacturing condition is changed in S320, the semiconductor substrate is individualized in the trial manufacturing process again (S300). Then, it is determined whether there is the problem by checking the degree of breakage of the semiconductor chip (S310). When there is the problem, steps S300 to S320 are repeated until there is no problem. When it is determined in S310 that there is no problem, the manufacturing condition is used as the manufacturing condition in the mass production process (S330).

In the initial S300, the fine groove on the front surface side of the semiconductor substrate may be a shape that does not have the second groove portion, and may be only a groove portion formed by single etching. Further, if there is no breakage problem in the fine grooves, the fine groove may be used in the mass production process. Contrarily, if there is the breakage problem, in S320, the manufacturing process may be changed so that the second groove portion is formed, or the manufacturing process may be changed so that the groove portion is formed by plural etchings instead of the single etching.

Hereinbefore, the preferred embodiments of the invention are described, but the respective embodiments, or the respective functions or structures disclosed in the embodiments may be combined in a range where the operations or effects are not inconsistent. Further, the invention is not limited to a specific embodiment, and may include various modifications and changes in a range of the scope of the invention disclosed in claims.

For example, the groove 170 on the rear surface side may be formed in a depth that reaches the vicinity of the fine groove on the front surface side but does not communicate with the fine groove on the front surface side. That is, in the process of forming the groove 170 on the rear surface side shown in FIG. 3B, the groove 170 on the rear surface side may be formed by remaining a part of the thickness of the semiconductor substrate. With such a configuration, since the thickness of the step portion can be secured, breakage is suppressed. In this case, in a subsequent process, by dividing the remaining part by applying stress such as tensile stress or bending stress to the semiconductor substrate, the semiconductor substrate may be divided. In this way, in the manufacturing method of the semiconductor piece that does not communicate with the groove on the rear surface side, similarly, by providing the second groove portion having the width greater than that of the first groove portion, when applying the stress to divide the remaining part, only the thickness part that remains between the fine groove on the front surface side and the groove 170 on the rear surface side is easily divided. Further, unintentional enlargement of the fine groove breakage, crack, or the like to the vicinity of the fine groove on the front surface side is suppressed, and as a result, the breakage of the semiconductor piece is suppressed. Further, with respect to the manufacturing method of the semiconductor piece that does not communicate with the groove on the rear surface side, the respective functions, structures or the like disclosed in the embodiments, such as the relationship between the shape or position of the first groove portion or the second groove portion described in the embodiments and the shape or position of the dicing blade, may be combined in a range where operations or effects are not inconsistent.

Further, in the preferred embodiments of the invention, an example in which the opening width Sa1 of the substrate on the front surface is narrower than the width of the groove 170 on the rear surface side is shown. This is a preferred embodiment since the number of acquired semiconductor pieces increases, compared with a full dicing method like the width of the groove 170. On the other hand, from the viewpoint of suppressing the remaining of the adhesive layer in the fine groove on the front surface, the relationship between the width of the opening width Sa1 of the substrate on the front surface and the width of the groove 170 on the rear surface side is arbitrary. In this case, the widths may be the same, or the width of the groove 170 may be narrower than the width of the opening width Sa1.

Further, as a tip shape of the rotating cutting member that forms the groove 170 on the rear surface side, a tip section seen in the rotation direction may be a semicircular shape or a tapered shape, instead of the rectangular shape shown in FIG. 5B. Further, as the cutting member that forms the groove 170 on the rear surface side, a cutting member other than the cutting member that is in contact with the substrate while rotating, such as a laser apparatus, may be used. That is, the groove 170 on the rear surface side may be formed by laser processing. Further, as an application example of the fine groove on the front surface of the invention, the invention may be applied to a case where respective devices are individualized from a substrate that does not include a semiconductor, made of glass, polymer or the like. For example, the invention may be applied to a MEMS substrate that does not include a semiconductor.

Further, the respective processes in the embodiments of the invention may be performed by plural subjects. For example, a first subject may form the groove on the front surface side, and then, a second subject may be supplied with the substrate on which the groove on the front surface side is formed by the first subject to prepare the substrate, may form the groove on the rear surface side on the prepared substrate, and may individualize (divide) the substrate. That is, the substrate on which the groove on the front surface side is formed may be prepared by the first subject, or may be prepared by the second subject.

The semiconductor piece manufacturing method of the invention is applied to a method for dividing (individualizing) a substrate shaped member such as a semiconductor wafer on which plural semiconductor devices are formed to manufacture respective semiconductor pieces (semiconductor chips). The semiconductor device formed on the substrate is not particularly limited, and may include a light emitting device, an active device, a passive device, or the like. In a preferred embodiment, the manufacturing method of the invention is applied to a method of extracting a semiconductor piece including a light emitting device from a substrate, in which the light emitting device may be a surface light emitting type semiconductor laser, a light emitting diode, or a light emitting thyristor, for example.

The foregoing description of the exemplary embodiments of the present invent ion has been provided for the purposes of illustration and description. It is not intende d to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor piece manufacturing method comprising:
    forming a front groove on a front surface side, the front groove including:
        a first groove portion having a first width from a front surface of a substrate; and
        a second groove portion that is positioned in a lower part that communicates with the first groove portion and has a second width larger than the first width; and
    forming a rear groove on a rear surface side having a width greater than the first width along the second groove portion from a rear surface of the substrate using a rotating cutting member,
    wherein a tip portion of the cutting member has a tapered shape in which a thickness decreases toward a tip of the cutting member, and
    wherein the second width is a width including a width where a position of a top portion of the cutting member of the tapered shape varies in a groove width direction due to accuracy of a manufacturing apparatus to be used.

2. The semiconductor piece manufacturing method according to claim 1,
    wherein the rear groove on the rear surface side is formed in a depth that reaches the second groove portion but does not reach the first groove portion.

3. The semiconductor piece manufacturing method according to claim 2,
    wherein a height from an upper end of the second groove portion to a lower end thereof is a height including a range where a depth of the rear groove on the rear surface side varies due to the accuracy of a cutting apparatus to be used in a thickness direction of the substrate.

4. The semiconductor piece manufacturing method according to claim 2,
    wherein the rear groove on the rear surface side is formed in a depth that does not exceed a depth at which the second width becomes maximum.

5. The semiconductor piece manufacturing method according to claim 2,
    wherein the height from the upper end of the second groove portion to the lower end thereof is a height including a range where the depth of the rear groove on the rear surface side varies due to abrasion of the cutting member from the time when the cutting member starts cutting a single substrate to the time when the cutting of the substrate is completely finished.

6. The semiconductor piece manufacturing method according to claim 1,
    wherein the rear groove on the rear surface side is formed while remaining a part of the thickness of the substrate in the process of forming the rear groove on the rear surface side,
    wherein the manufacturing method further comprising a process of applying stress to the substrate after the rear groove on the rear surface side is formed to divide the remaining part thereof.

7. The semiconductor piece manufacturing method according to claim 1,
    wherein the second width is larger than a thickness of the cutting member.

8. The semiconductor piece manufacturing method according to claim 1,
    wherein the second width is a width including a width where a center of the cutting member in a thickness direction varies in a groove width direction due to accuracy of a manufacturing apparatus to be used.

9. The semiconductor piece manufacturing method according to claim 1,
    wherein the second width is a width including a range where the rear groove on the rear surface side varies due to accuracy of a manufacturing apparatus to be used in a groove width direction.

10. The semiconductor piece manufacturing method according to claim 1,
    wherein the second groove portion has a side surface of a spherical shape that is enlarged from a lower end of the first groove portion in a groove width direction and a rear surface direction.

11. The semiconductor piece manufacturing method according to claim 1,
    wherein the first groove portion is formed by first etching, and the second groove portion is formed by second etching a condition of which is different from the first etching.

12. The semiconductor piece manufacturing method according to claim 11,
    wherein the second etching is isotropic etching.

13. The semiconductor piece manufacturing method according to claim 11,
    wherein the first etching is anisotropic etching.

14. The semiconductor piece manufacturing method according to claim 11,
    wherein the first etching and the second etching are isotropic etching, and
    wherein a protective film is formed on a side wall of the first groove portion after the first etching, and the second etching is performed after the protective film is formed.

15. The semiconductor piece manufacturing method according to claim 11,
    wherein the first etching and the second etching are anisotropic etching, and
    wherein the second etching having a strong etching strength in a side wall direction of a groove compared with the first etching is performed after the first etching to form the front groove on the front surface side.

16. The semiconductor piece manufacturing method according to claim 11,
    wherein the first etching is anisotropic dry etching, and
    wherein the second etching is isotropic dry etching or anisotropic dry etching.

17. The semiconductor piece manufacturing method according to claim 11,
    wherein the first etching and the second etching are dry etching, wherein an etching gas used for the dry etching includes a protective film forming gas and a gas for etching, and wherein a flow rate of the protective film forming gas in the first etching is larger than a flow rate of the protective film forming gas in the second etching.

18. The semiconductor piece manufacturing method according to claim 11, wherein the first etching and the second etching are dry etching, wherein an etching gas used for the dry etching includes a protective film forming gas and a gas for etching, and wherein a flow rate of the gas for etching in the first etching is larger than a flow rate of the gas for etching in the second etching.

19. A semiconductor piece manufacturing method comprising:

forming a front groove on a front surface side, the front groove including:
a first groove portion having a first width from a front surface of a substrate; and
a second groove portion that is positioned in a lower part that communicates with the first groove portion and has a second width larger than the first width;

forming a rear groove on a rear surface side having a width greater than the first width along the second groove portion from a rear surface of the substrate using a rotating cutting member;

attaching a holding member having an adhesive layer to the front surface of the substrate on which the front groove on the front surface side is formed; and separating the holding member from the front surface after the rear groove on the rear surface side is formed, wherein the first groove portion has a shape that does not have a portion of which the width is enlarged from the front surface of the substrate to the rear surface, and wherein the second groove portion has a shape in which the width gradually increases from the lower end of the first groove portion to the rear surface.

20. The semiconductor piece manufacturing method according to claim 19, wherein the first groove portion has a depth in which the adhesive layer does not enter the second groove portion after the rear groove on the rear surface side is formed.

21. A semiconductor piece manufacturing method comprising:

forming a first groove portion by first etching from a front surface of a substrate;

after the formation of the first groove portion, forming a second groove portion that is positioned in a lower part that communicates with the first groove portion; and forming a rear groove on a rear surface side having a width greater than a groove width of the first groove portion along the second groove portion from a rear surface of the substrate using a rotating cutting member, wherein the first groove portion has a shape that does not have a portion of which the width is enlarged from the front surface of the substrate to the rear surface, and wherein the second groove portion has a. shape in which the width gradually increases from the lower end of the first groove portion to the rear surface.

* * * * *